(12) United States Patent
Scheuerlein et al.

(10) Patent No.: US 8,576,651 B2
(45) Date of Patent: Nov. 5, 2013

(54) TEMPERATURE COMPENSATION OF CONDUCTIVE BRIDGE MEMORY ARRAYS

(75) Inventors: Roy E. Scheuerlein, Cupertino, CA (US); George Samachisa, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 131 days.

(21) Appl. No.: 13/354,796

(22) Filed: Jan. 20, 2012

(65) Prior Publication Data
US 2013/0188431 A1 Jul. 25, 2013

(51) Int. Cl.
G11C 7/04 (2006.01)
G11C 5/14 (2006.01)

(52) U.S. Cl.
USPC .............. 365/211; 365/185.18; 365/185.2; 365/189.09

(58) Field of Classification Search
USPC ........ 365/185.18, 185.2, 185.28, 189.09, 211
See application file for complete search history.

(56) References Cited

U.S. PATENT DOCUMENTS

| | | | |
|---|---|---|---|
| 5,864,504 A | 1/1999 | Tanzawa | |
| 6,205,074 B1 * | 3/2001 | Van Buskirk et al. | 365/211 |
| 6,269,026 B1 * | 7/2001 | Venkatesh et al. | 365/185.29 |
| 6,560,152 B1 | 5/2003 | Cernea | |
| 6,801,454 B2 | 10/2004 | Wang | |
| 6,815,077 B1 | 11/2004 | Herner | |
| 6,831,854 B2 | 12/2004 | Rinerson | |
| 6,870,766 B2 | 3/2005 | Cho | |
| 6,944,057 B1 | 9/2005 | Runnion | |
| 7,057,958 B2 | 6/2006 | So | |
| 7,362,604 B2 | 4/2008 | Scheuerlein | |
| 7,391,650 B2 | 6/2008 | Mokhlesi | |
| 7,426,128 B2 | 9/2008 | Scheuerlein | |
| 7,460,407 B2 | 12/2008 | Mokhlesi | |
| 7,463,528 B2 | 12/2008 | Mokhlesi | |
| 7,583,535 B2 | 9/2009 | Sekar | |
| 7,583,539 B2 | 9/2009 | Sekar | |
| 7,656,710 B1 * | 2/2010 | Wong | 365/185.19 |
| 7,733,685 B2 | 6/2010 | Scheuerlein | |
| 7,755,946 B2 | 7/2010 | Dunga | |
| 7,974,133 B2 | 7/2011 | Dunga | |
| 7,974,134 B2 | 7/2011 | Zhang | |
| 7,974,146 B2 | 7/2011 | Barkley | |
| 7,999,529 B2 | 8/2011 | Thorp | |
| 2004/0160806 A1 | 8/2004 | Rinerson | |
| 2005/0078537 A1 * | 4/2005 | So et al. | 365/211 |
| 2007/0195603 A1 * | 8/2007 | Aritome et al. | 365/185.23 |
| 2008/0158975 A1 | 7/2008 | Sekar | |
| 2008/0247253 A1 * | 10/2008 | Nguyen et al. | 365/211 |
| 2010/0067287 A1 | 3/2010 | Porter | |
| 2010/0110815 A1 * | 5/2010 | Lee et al. | 365/211 |
| 2010/0259961 A1 | 10/2010 | Fasoli | |
| 2011/0075468 A1 | 3/2011 | Scheuerlein | |
| 2011/0205823 A1 | 8/2011 | Hemink | |

* cited by examiner

*Primary Examiner* — Ly D Pham
(74) *Attorney, Agent, or Firm* — Vierra Magen Marcus LLP

(57) ABSTRACT

Methods for operating a semiconductor memory array including dynamically adjusting control line voltages (e.g., unselected word line or unselected bit line voltages) based on one or more array conditions associated with the semiconductor memory array are described. The one or more array conditions may include a temperature associated with the semiconductor memory array or a particular number of write cycles associated with the semiconductor memory array. In some embodiments, an intermediate voltage is generated based on the one or more array conditions and applied to the unselected word lines and the unselected bit lines of the semiconductor memory array. The one or more intermediate voltages may be generated such that a first voltage difference across unselected memory cells sharing a selected word line is different from a second voltage difference across other unselected memory cells sharing a selected bit line based on the one or more array conditions.

35 Claims, 21 Drawing Sheets

TEMPERATURE COMPENSATION OF CONDUCTIVE BRIDGE MEMORY ARRAYS

BACKGROUND

Semiconductor memory is widely used in various electronic devices such as cellular telephones, digital cameras, personal digital assistants, mobile computing devices, and non-mobile computing devices. A non-volatile memory device (e.g., a NAND flash memory) allows information to be stored and retained even when the non-volatile memory device is not connected to a source of power (e.g., a battery). Non-volatile memory devices typically include two-dimensional arrays of non-volatile memory cells. The memory cells within a two-dimensional array form a single layer of memory cells and may be selected via control lines in the X and Y directions. Non-volatile memory devices may also include monolithic three-dimensional memory arrays in which multiple layers of memory cells are formed above a single substrate without any intervening substrates. Exemplary three-dimensional memory arrays are described in U.S. Pat. No. 6,034,882 to Johnson, entitled "Vertically Stacked Field Programmable Nonvolatile Memory and Method of Fabrication."

DETAILED DESCRIPTION

Technology is described for operating a semiconductor memory array including dynamically adjusting control line voltages (e.g., unselected word line or unselected bit line voltages) based on one or more array conditions associated with the semiconductor memory array. The one or more array conditions may include a temperature associated with the semiconductor memory array or a particular number of write cycles associated with the semiconductor memory array. In some embodiments, an intermediate voltage is generated based on the one or more array conditions and applied to the unselected word lines and the unselected bit lines of the semiconductor memory array. The one or more intermediate voltages may be generated such that a first voltage difference across unselected memory cells sharing a selected word line is different from a second voltage difference across other unselected memory cells sharing a selected bit line based on the one or more array conditions.

In some cases, a semiconductor memory array may include a cross-point memory array. A cross-point memory array comprises a memory array in which two-terminal memory cells are placed at the intersections of a first set of control lines arranged in a first direction and a second set of control lines arranged in a second direction perpendicular to the first direction. Each memory cell in a cross-point memory array may be placed in series with a steering element, such as a diode, in order to reduce leakage currents associated with unselected memory cells. One issue involving the programming of memory cells in a semiconductor memory array is that memory cell programming characteristics (e.g., the programming characteristics of a conductive bridge memory element) may vary greatly over temperature. The variation of memory cell programming characteristics over temperature may affect the rate of programming for a memory cell being programmed and/or may lead to disturb of previously programmed memory cells. Thus, there is a need to compensate for temperature variations associated with both the selected memory cells and the unselected memory cells in a semiconductor memory array.

Figure 1A:
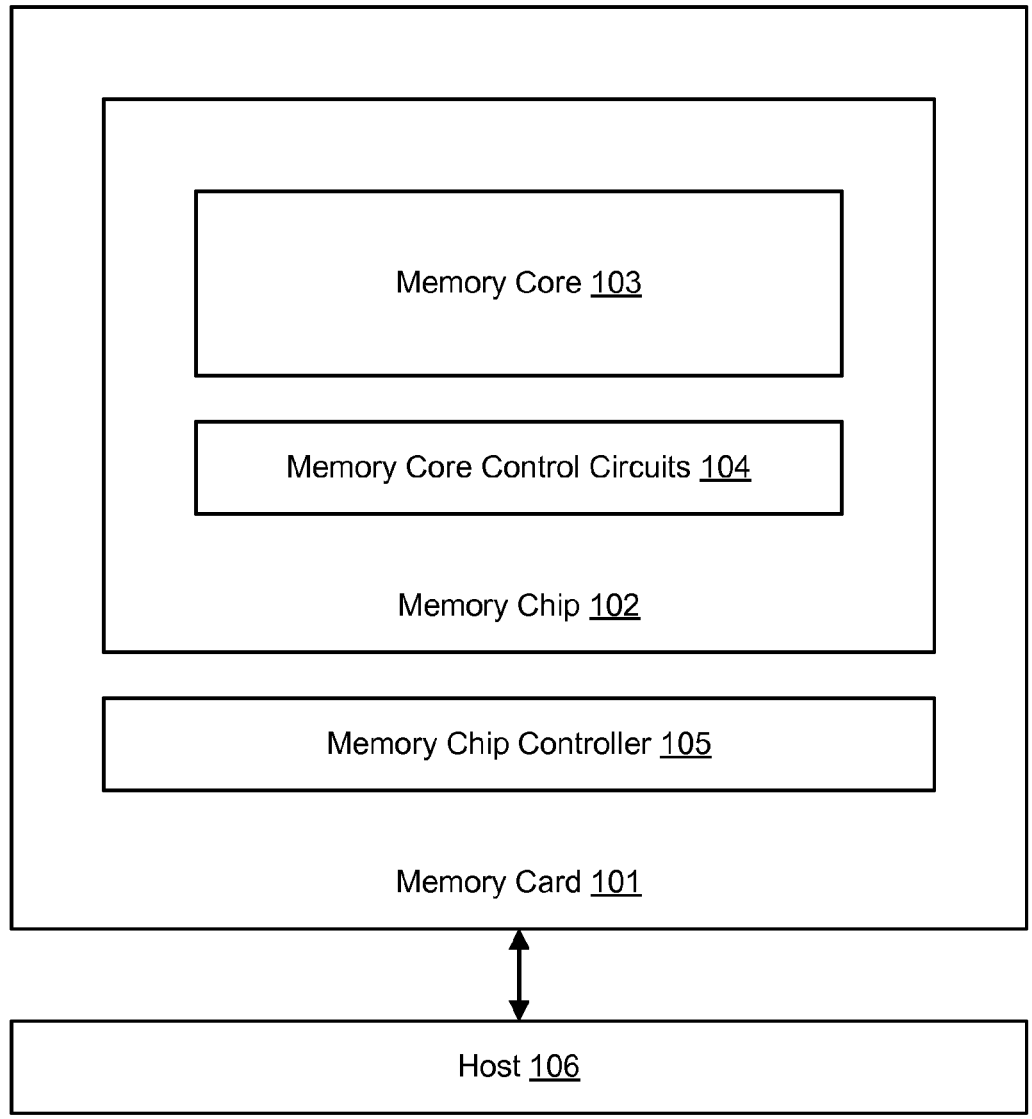
FIG. 1A depicts one embodiment of a memory system.

FIG. 1A depicts one embodiment of a memory system 100. Memory system 100 includes a host 106 (e.g., a personal computer or mobile computing device) and a memory card 101. The memory card 101 includes a memory chip controller 105 and a memory chip 102. The memory chip controller 105, which may include one or more state machines, page registers, SRAM, or other control logic for controlling the operation of memory chip 102, receives data and commands from host 106 and provides memory chip data to host 106. In one embodiment, the memory chip controller 105 and memory chip 102 may be arranged on a single integrated circuit. In other embodiments, memory chip controller 105 and memory chip 102 may be arranged on different integrated circuits. The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 and memory core 103 are arranged on different integrated circuits.

Referring to FIG. 1A, a memory card operation may be initiated when host 106 sends instructions to memory chip controller 105 indicating that it would like to read data from memory card 101 or write data to memory card 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

Figure 1B:
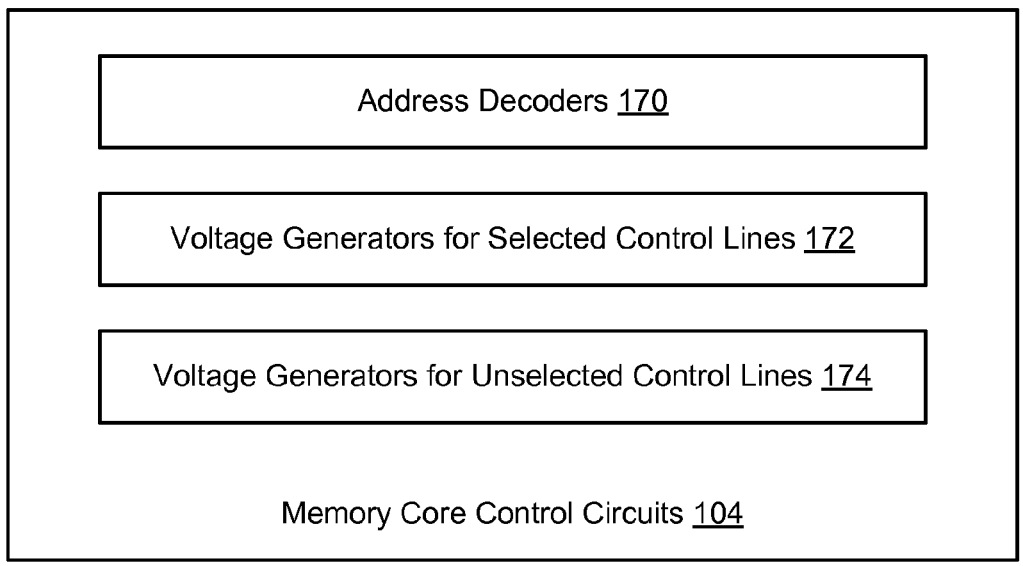
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
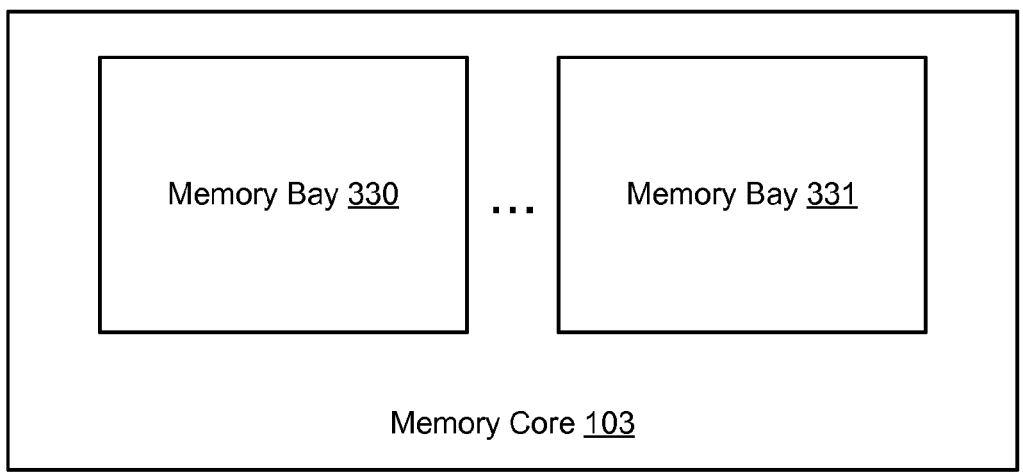
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
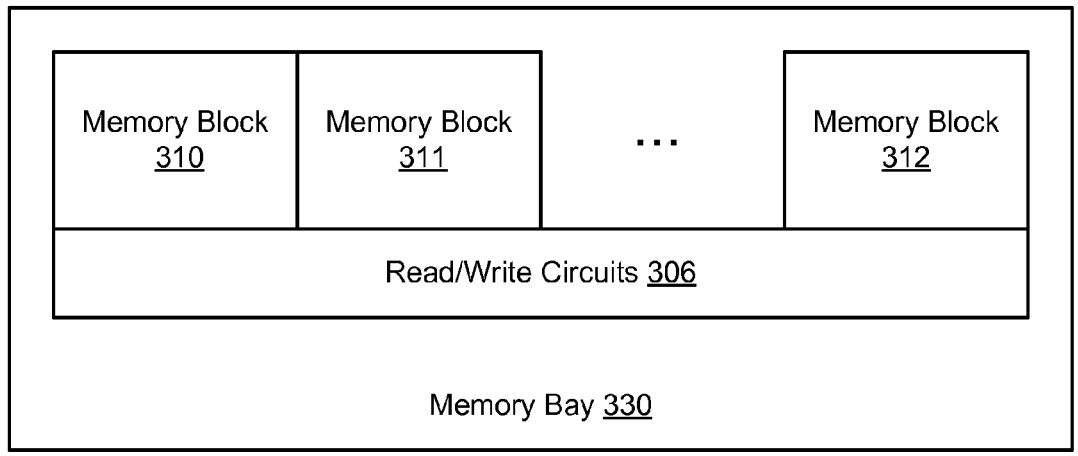
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block should be electrically coupled to read/write circuits 306 at a particular time to avoid signal conflicts.

Figure 1E:
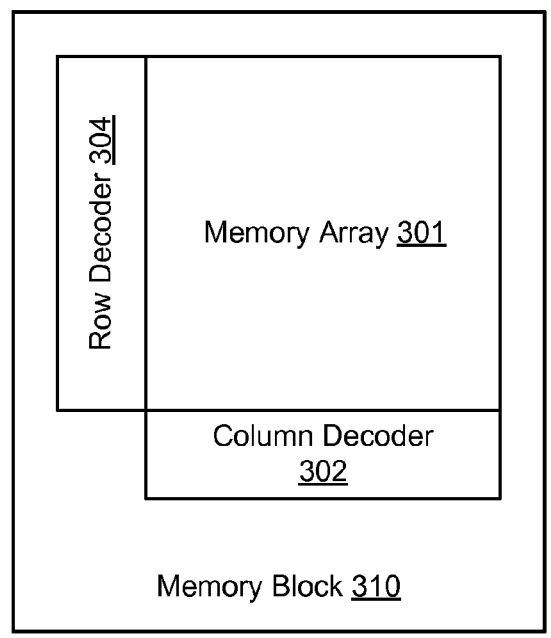
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells (i.e., memory array 310 may comprise a two-dimensional memory array or a three-dimensional memory array). The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
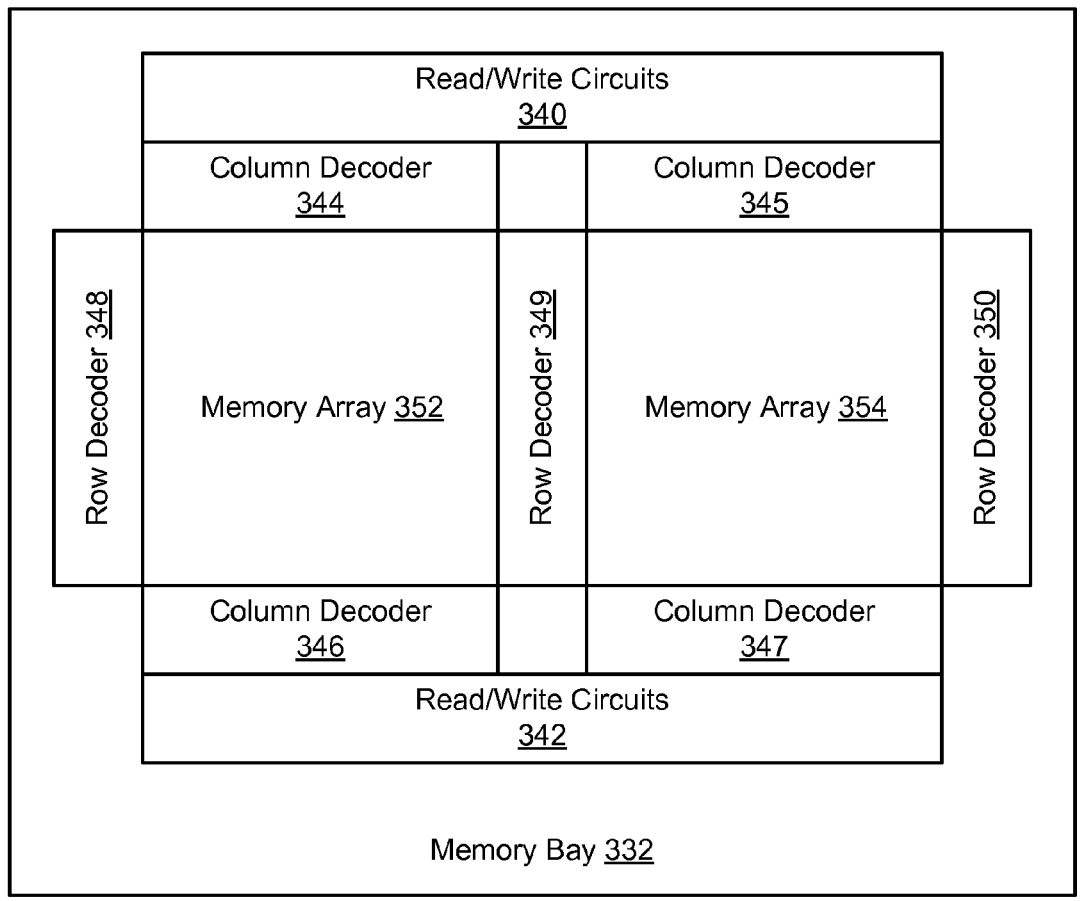
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split allows for a more efficient layout of the memory bay.

Figure 2A:
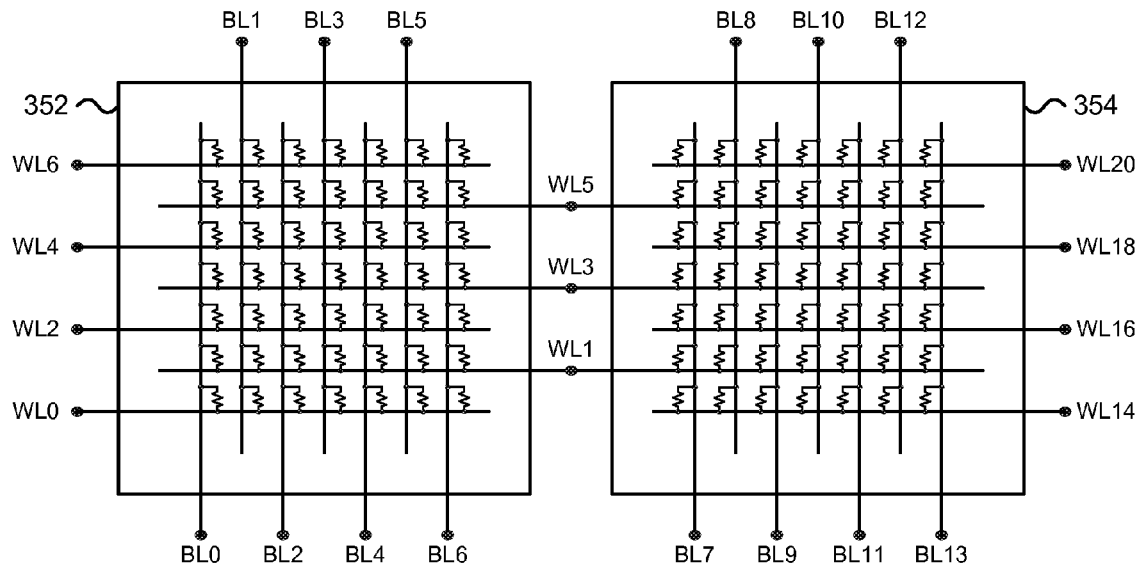
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical to the supporting substrate (i.e., the vertical plane is perpendicular to the supporting substrate).

Figure 2B:
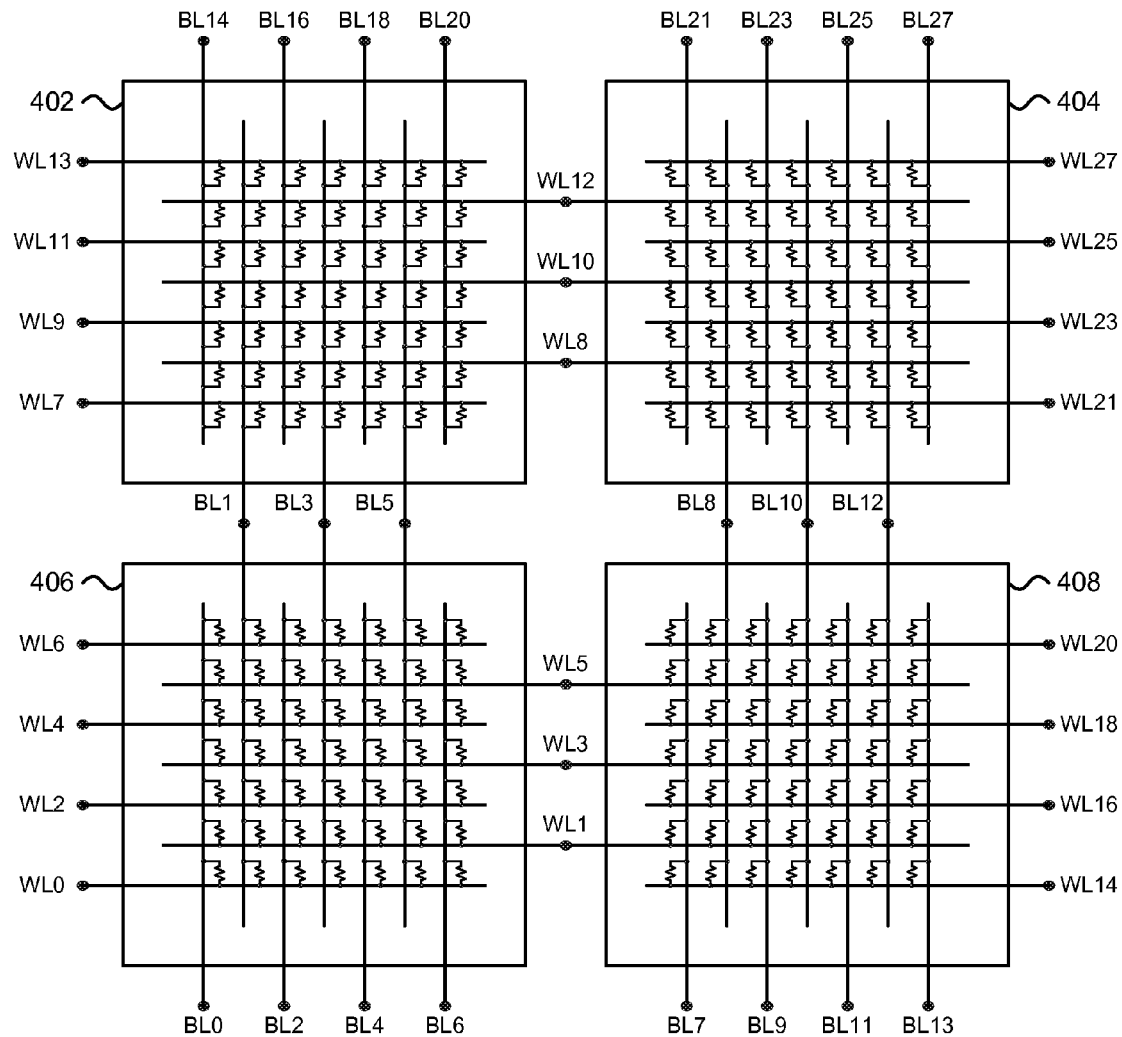
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
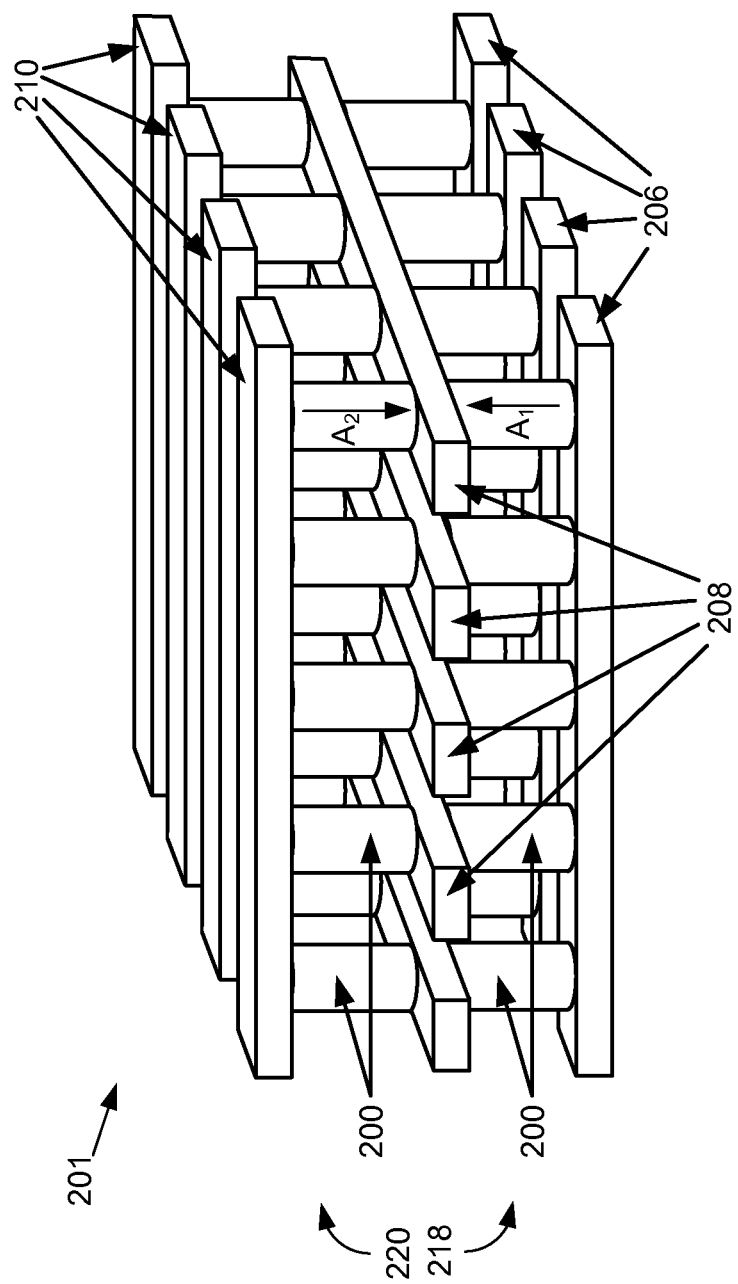
FIG. 3A depicts one embodiment of a portion of a monolithic three-dimensional memory array.

FIG. 3A depicts one embodiment of a portion of a monolithic three-dimensional memory array 201 that includes a first memory level 218 positioned below a second memory level 220. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines. In some embodiments, the memory levels may be formed as described in U.S. Pat. No. 6,952,030, "High-Density Three-Dimensional Memory Cell," which is hereby incorporated by reference in its entirety. More information regarding suitable embodiments of three-dimensional memories can be found in the following United States patents that are herein incorporated by reference in their entirety: U.S. Pat. No. 6,879,505; U.S. Pat. No. 7,286,439; U.S. Pat. No. 6,856,572; and U.S. Pat. No. 7,359,279.

As depicted in FIG. 3A, memory array 201 includes a plurality of memory cells 200. The memory cells 200 may include write-once memory cells or re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode from a memory cell may reduce the process complexity and costs associated with manufacturing a memory array.

In one embodiment, the memory cells 200 of FIG. 3A include re-writable non-volatile memory cells. In one example, U.S. Patent Application Publication No. 2006/0250836, which is herein incorporated by reference in its entirety, describes a rewriteable non-volatile memory cell that includes a diode coupled in series with a reversible resistance-switching element. A reversible resistance-switching element includes reversible resistivity-switching material having a resistivity that may be reversibly switched between two or more states. In one embodiment, the reversible resistance-switching material may include a metal oxide. The metal oxide may include nickel oxide or hafnium oxide. In another embodiment, the reversible resistance-switching material may include a phase-change material. The phase-change material may include a chalcogenide material.

In another embodiment, the memory cells 200 of FIG. 3A include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. More information regarding conductive bridge memory elements can be found in U.S. Patent Application 2011/0062408, "Programmable Metallization Cell Structure Including an Integrated Diode."

Referring to FIG. 3A, in one embodiment of a read operation, the data stored in one of the plurality of memory cells 200 may be read by biasing one of the word lines (i.e., the selected word line) to the selected word line voltage in read mode (e.g., 0.4V). A read circuit is then used to bias a selected bit line connected to the selected memory cell to the selected bit line voltage in read mode (e.g., 0V). In some cases, in order to avoid sensing leakage current from the many unselected word lines to the selected bit line, the unselected word lines may be biased to the same voltage as the selected bit lines (e.g., 0V). To avoid leakage current from the selected word line to the unselected bit lines, the unselected bit lines may be biased to the same voltage as the selected word line (e.g., 0.4V); however, biasing the unselected word lines to the same voltage as the selected bit lines and biasing the unselected bit lines to the same voltage as the selected word line will place a large voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. Leakage current is subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation is similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET requires a higher than normal voltage and is referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 1.2V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
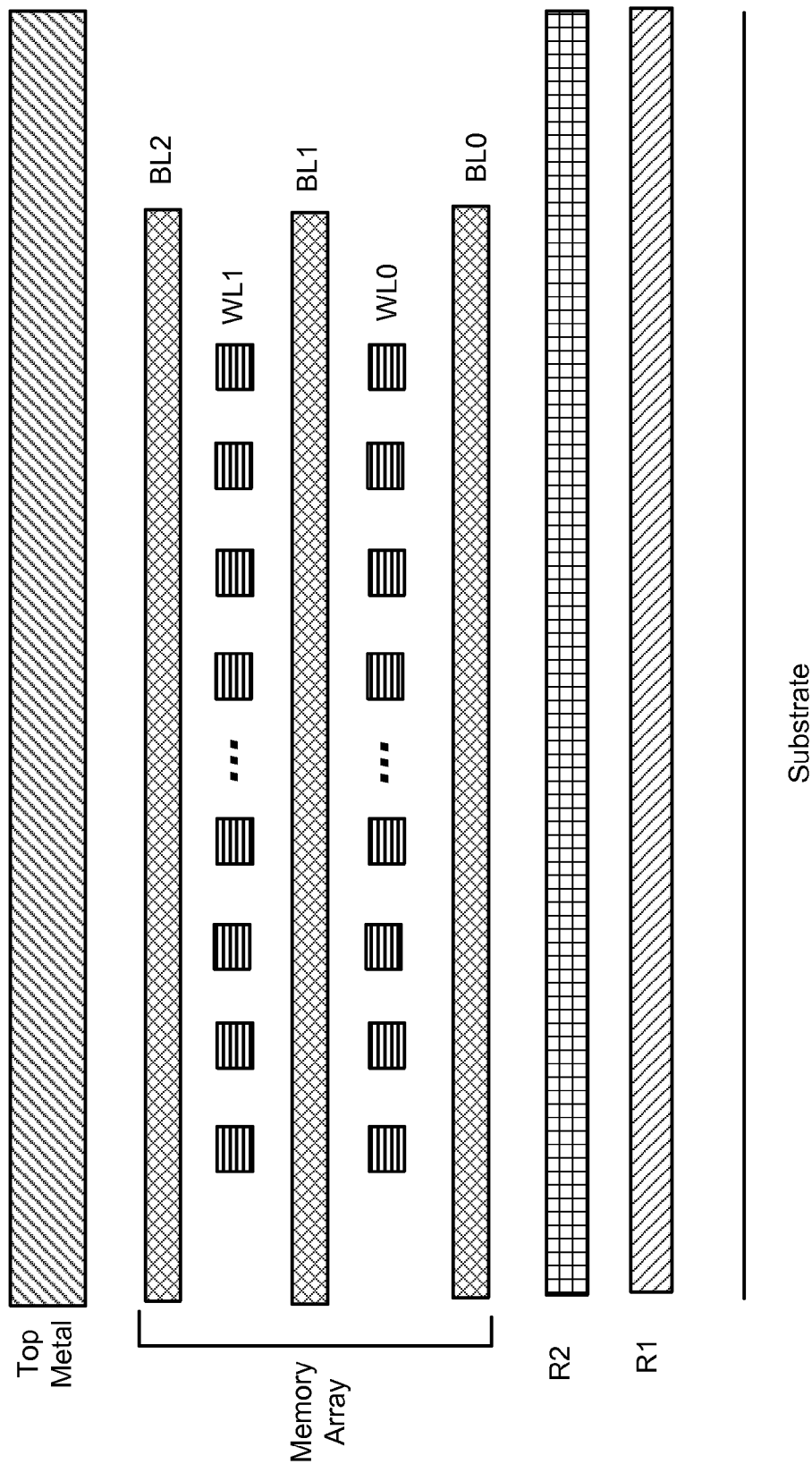
FIG. 3B depicts a subset of the memory array and routing layers of one embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit such as the Top Metal layer. In one example, the Top Metal layer is formed of copper or aluminum (about 0.05 ohms/square), which may provide a smaller resistance per unit area than layers R1 and R2. Metals layers R1 and R2 may not be implemented using the same materials as those used for the Top Metal layers because the metal used for R1 and R2 must be able to withstand the processing steps for fabricating the Memory Array layers on top of R1 and R2.

Figure 4:
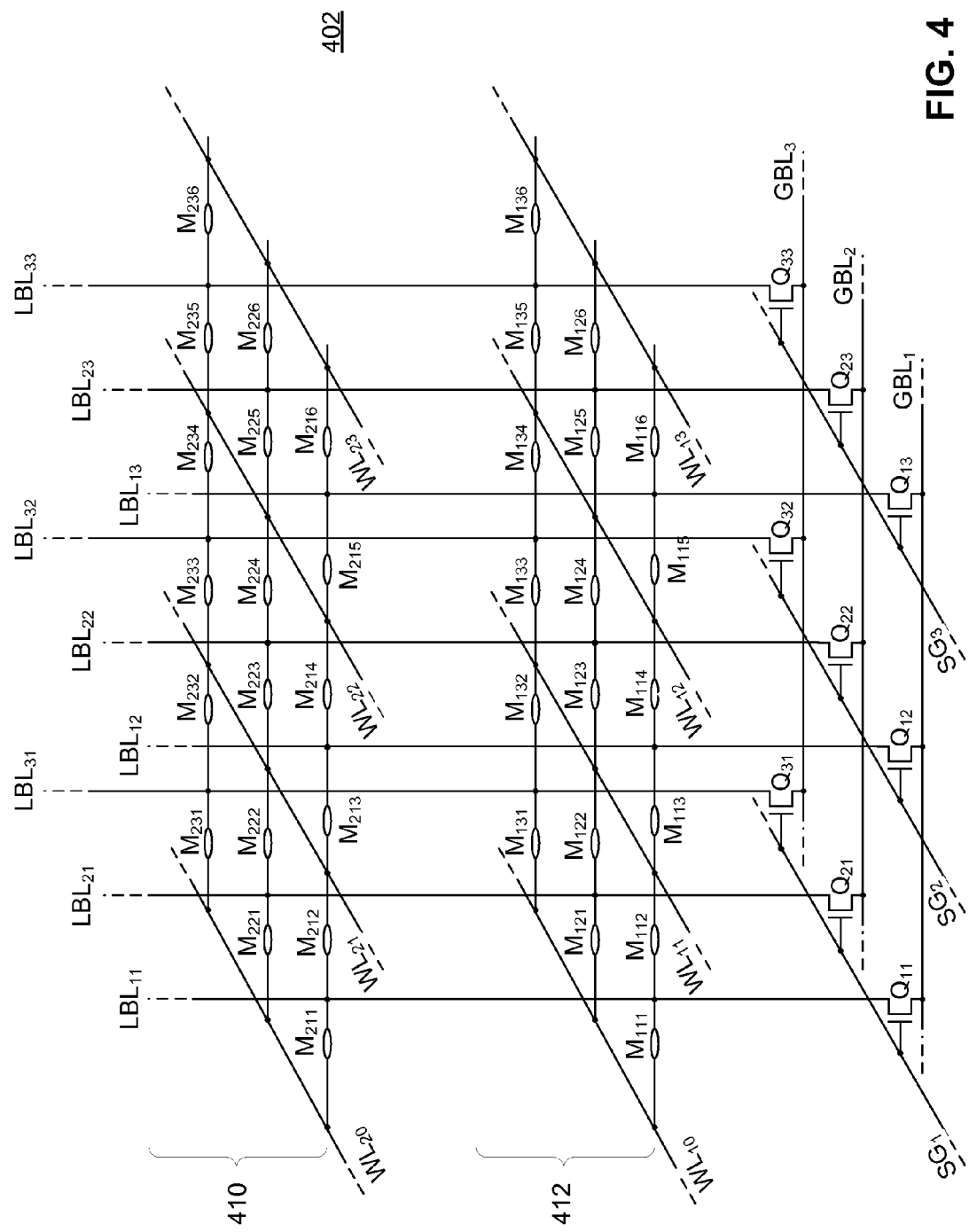
FIG. 4 depicts one embodiment of a portion of a monolithic three-dimensional memory array.

FIG. 4 depicts one embodiment of a portion of a monolithic three-dimensional memory array 402 that includes a first memory level 412 positioned below a second memory level 410. Memory array 402 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $W1_{10}$). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 402, includes a greater number of memory cells along the word lines as compared with the number of memory cells along the bit lines. For example, the number memory cells along each bit line may be 16, while the number of memory cells along each word line may be 2048. More information regarding the structure and operation of vertical bit line memory arrays can be found in U.S. Provisional Application 61/423,007, "Non-Volatile Memory Having 3D Array of Read/Write Elements With Vertical Bit Lines and Laterally Aligned Active Elements and Methods Thereof" and U.S. patent application Ser. No. 13/323,703, "Three Dimensional Non-Volatile Storage with Three Device Driver for Row Select," both of which are herein incorporated by reference in their entirety.

Figure 5:
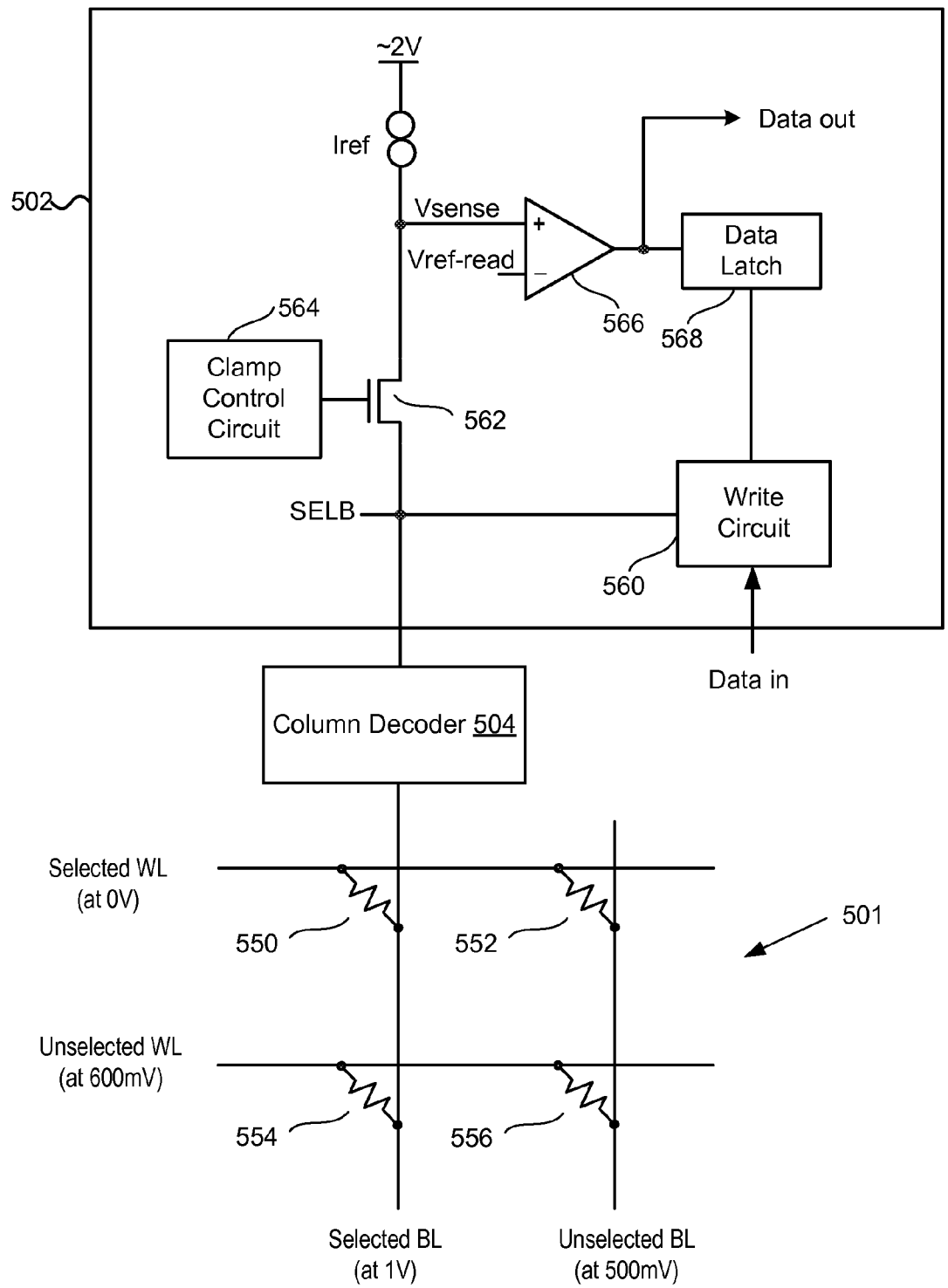
FIG. 5 depicts one embodiment of a read/write circuit along with a portion of a memory array.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 3A. In another embodiment, the portion of a memory array 501 may comprise a memory array with bit lines arranged in a vertical direction that is perpendicular to the substrate, such as memory array 402 in FIG. 4. As depicted, the selected bit line is biased to 1V, the unselected word line is biased to 0.6V, the selected word line is biased to 0V, and the unselected bit line is biased to 0.5V.

In some embodiments, the memory array biasing scheme of FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 is electrically coupled to the selected bit line via column decoder 504. In one embodiment, column decoder 504 may correspond with column decoder 302 depicted in FIG. 1E. Transistor 562 couples node SELB to the Vsense node. Clamp control circuit 564 controls transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the data in terminal, and data latch 568.

During a read operation, read/write circuit 502 biases the selected bit line to the selected bit line voltage in read mode. Prior to sensing data, read/write circuit 502 will precharge the Vsense node to 2V. When sensing data, read/write circuit 502 attempts to regulate the SELB node to 1V via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 will latch the output of sense amplifier 566 after a time period of sensing the current through the selected memory cell (e.g., 400 ns).

In one embodiment, during a write operation, if the data in terminal requests a data "0" to be written to a selected memory cell, then read/write circuit 502 biases SELB to the selected bit line voltage in write mode (e.g., 1.2V for a SET operation) via write circuit 560. The duration of programming the memory cell can be a fixed time period (e.g., using a fixed-width programming pulse) or variable (e.g., using a write circuit 560 that senses whether a memory cell has been programmed while programming). More information regarding write circuits that can sense while programming data can be found in U.S. Pat. No. 6,574,145, "Memory Device and Method for Sensing While Programming a Non-Volatile Memory Cell," incorporated herein by reference in its entirety. If the data in terminal requests a data "1" to be written, then write circuit 560 may bias SELB to the unselected bit line voltage in write mode (e.g., 0V for a SET operation). The write circuit 560 may also bias SELB to a program inhibit voltage in write mode that is different from the unselected bit line voltage.

Figure 6A:
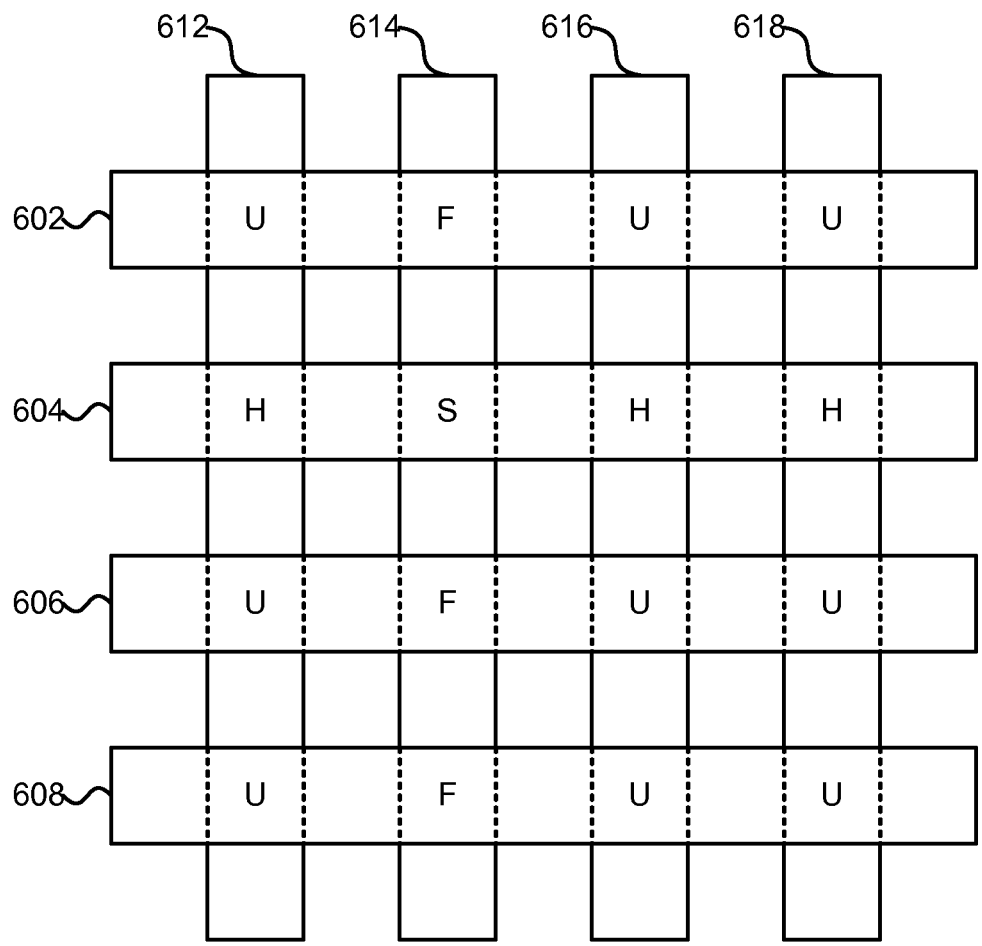
FIG. 6A depicts one embodiment of a cross-point memory array.

FIG. 6A depicts one embodiment of a cross-point memory array 610. The cross-point memory array 610 may correspond with memory array 201 in FIG. 3A or memory array 402 in FIG. 4. As depicted, cross-point memory array 610 includes word lines 602-608 and bit lines 612-618. Word line 604 comprises a selected word line and bit line 614 comprises a selected bit line. At the intersection of selected word line 604 and selected bit line 614 is a selected memory cell (an S cell). The voltage across the S cell is the difference between the selected word line voltage and the selected bit line voltage. Memory cells at the intersections of the selected word line 604 and the unselected bit lines 612, 616, and 618 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 614 and the unselected word lines 602, 606, and 608 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 602, 606, and 608 and the unselected bit lines 612, 616, and 618 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 602, may be associated with a particular page stored within the cross-point memory array 610.

Figure 6B:
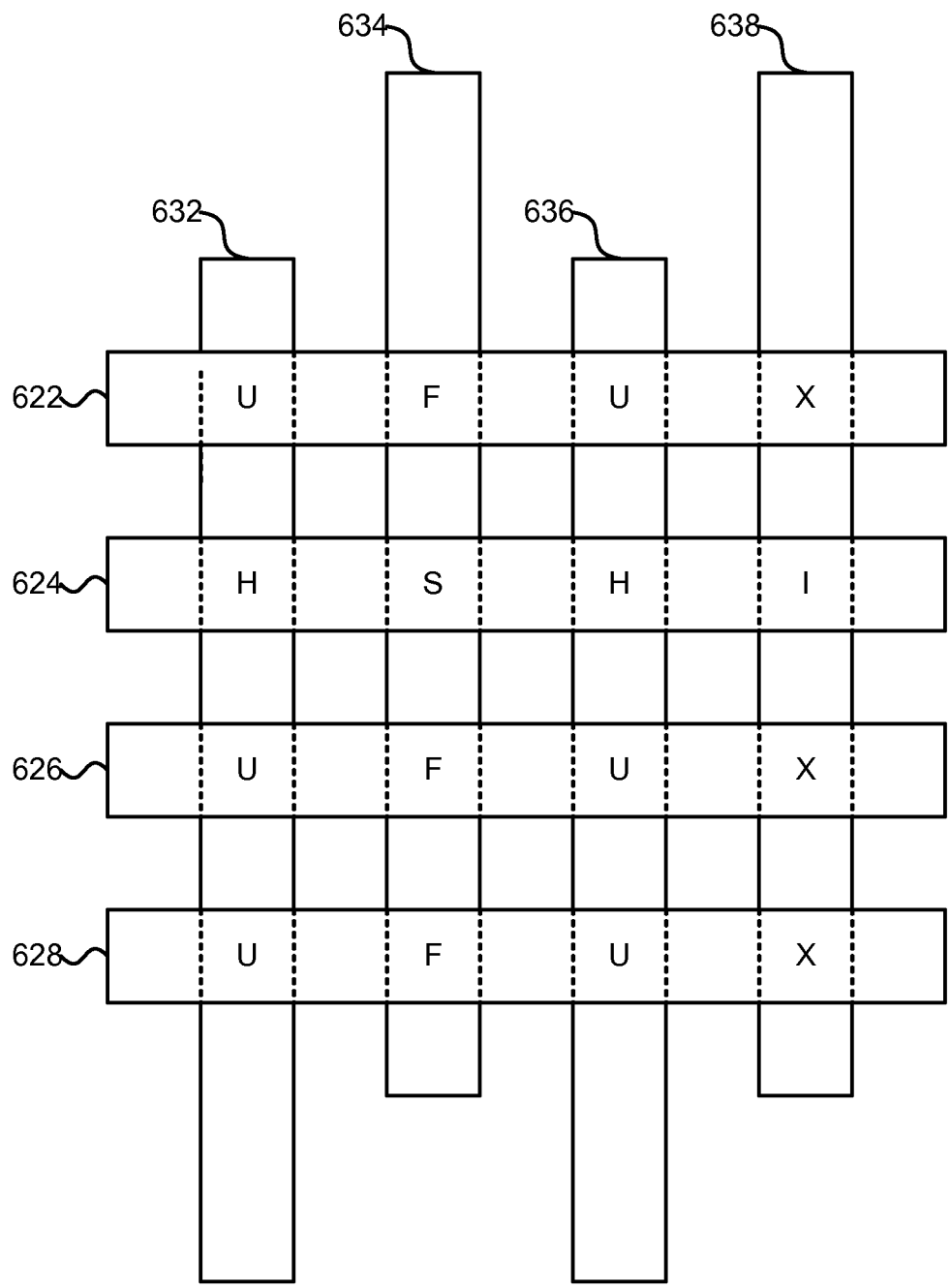
FIG. 6B depicts an alternative embodiment of a cross-point memory array.

FIG. 6B depicts an alternative embodiment of a cross-point memory array 620. The cross-point memory array 620 may correspond with memory array 201 in FIG. 3A or memory array 402 in FIG. 4. As depicted, cross-point memory array 620 includes word lines 622-628 and bit lines 632-638. Word line 624 comprises a selected word line and bit lines 634 and 638 comprise selected bit lines. Although both bit lines 634 and 638 are selected, the voltages applied to bit line 634 and bit line 638 may be different. For example, in the case that bit line 634 is associated with a first memory cell to be programmed (i.e., an S cell), then bit line 634 may be biased to a selected bit line voltage in order to program the first memory cell. In the case that bit line 638 is associated with a second memory cell that is not to be programmed (i.e., an I cell), then bit line 638 may be biased to a program inhibit voltage (i.e., to a bit line voltage that will prevent the second memory cell from being programmed).

At the intersection of selected word line 624 and selected bit line 638 is a program inhibited memory cell (an I cell). The voltage across the I cell is the difference between the selected word line voltage and the program inhibit voltage. Memory cells at the intersections of the selected bit line 638 and the unselected word lines 622, 626, and 628 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 638 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 622 may be associated with a first page and a second page. The first page may correspond with bit lines 632 and 636 and the second page may correspond with bit lines 634 and 638. In this case, the first page and the second page may correspond with interdigitated memory cells that share the same word line. When a memory array operation is being performed on the first page (e.g., a programming operation) and the selected word line 624 is biased to the selected word line voltage, one or more other pages also associated with the selected word line 624 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 620 may comprise resistive memory elements without isolating diodes. In another embodiment, a floating control line (e.g., bit line 636) comprises a portion of the memory array that may be undriven during an operation on memory cell S using a first selected control line (e.g., bit line 634). Selection devices connected to control line 636 may be turned off during the memory operation causing control line 636 to be floating. Since a portion of the memory cells connected to the control lines 634 and 636 are also connected to shared unselected second control lines 622, 626, and 628, the floating control lines will float to a voltage substantially the same as the voltage of the unselected second control lines. In one embodiment, the control lines 634 and 636 may comprise vertical bit lines in a three dimensional memory array comprising comb shaped word lines. More information regarding vertical bit line three dimensional memory arrays can be found in U.S. Provisional Application 61/526,764, "Optimized Architecture for Three Dimensional Non-Volatile Storage Device with Vertical Bit Lines" and U.S. patent application Ser. No. 13/323,573, "Three Dimensional Non-Volatile Storage with Multi Block Row Selection," both of which are herein incorporated by reference in their entirety.

Figure 7A:
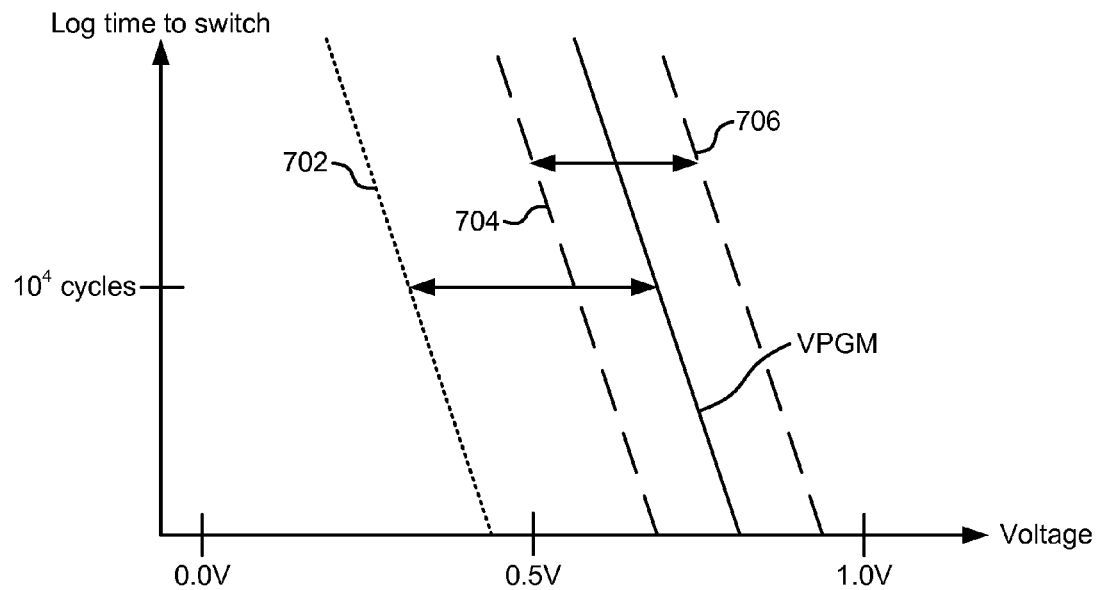
FIG. 7A depicts a graph of the time for a memory cell to switch given a first temperature over a voltage difference across the memory cell.

FIG. 7A depicts a graph of the time for a memory cell to switch given a first temperature (e.g., room temperature) over a voltage difference across the memory cell. The time to switch is the amount of time during which the memory cell must be stressed by the voltage difference at the first temperature in order to program the memory cell. As depicted, VPGM is the programming voltage for the memory cell at the first temperature. Variation in the programming voltage due to manufacturing variations is shown by the range bounded by lines 704 and 706, which comprise the boundaries of the expected variability for a given probability distribution (e.g., +/−4 sigma variation). Variation in the programming voltage due to temperature variations is shown by the range bounded by line 702 and VPGM. In some embodiments, VPGM may comprise a non-linear function. In general, as the temperature increases, the programming voltage decreases for a given time during which the memory cell is stressed.

Figure 7B:
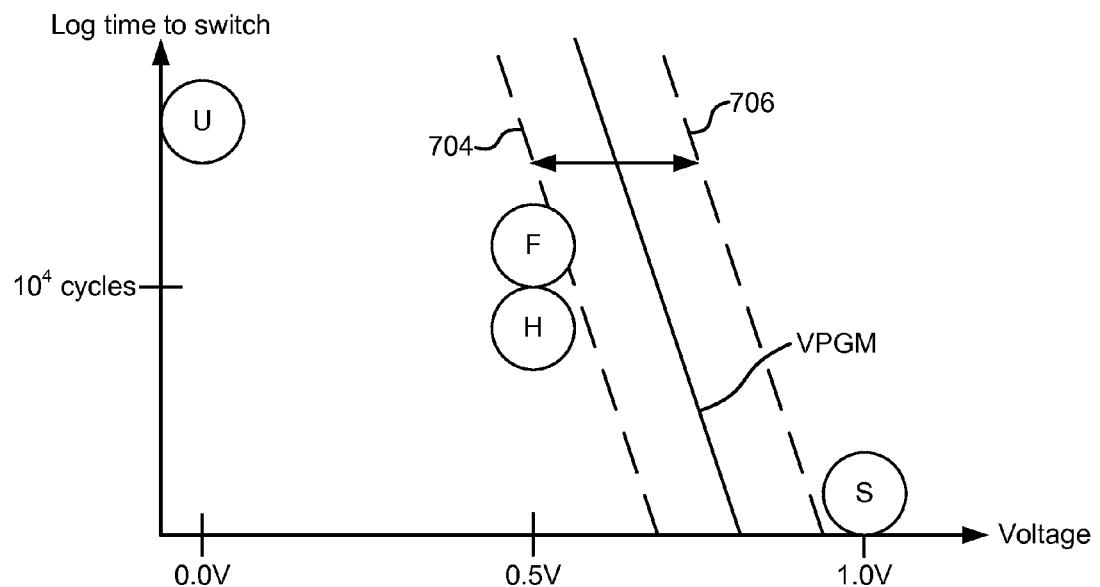
FIG. 7B depicts a graph of the time for a memory cell to switch given the first temperature used in FIG. 7A over a voltage difference across the memory cell.

FIG. 7B depicts a graph of the time for a memory cell to switch given the first temperature used in FIG. 7A (e.g., room temperature) over a voltage difference across the memory cell. The graph of FIG. 7B is similar to the graph of FIG. 7A, but also includes distributions for four types of memory cells (S, H, F, and U cells) represented as circles on the graph. Each of the four distributions represents a worst-case voltage stress duration (i.e., the worst-case accumulative time during which a particular cell type will be stressed before being refreshed or remapped). The particular memory array biasing scheme depicted in FIG. 7B shows that the accumulative duration of time during which the S cells will experience a 1V voltage stress is less than that of the H, F, and U cells. The accumulative duration of time during which the H cells are stressed may be less than that of the accumulative duration of time during which the F cells are stressed because H cells may be refreshed during a selective page refresh operation that is performed after writing a particular page in the memory array. The number of cells on an array line and the number of cells simultaneously programmed along an array line also effects the stress time for F and H cells and leads to differences in the total stress time for F and H cells. For example, the number of cells on the selected word line may be twice the number of cells on the selected bit line which would increase the stress time for H cells by a factor of two relative to the F cells; and the number of cells simultaneously programmed on the selected word line may be four while the number of cells simultaneously programmed on the selected bit line may be one which would decrease the stress time for H cells by a factor of four relative to the F cells. The combined effect causes a stress time for the H cells that is a factor of two lower than the stress time for the F cells. Many other relative stress times are possible depending on the particulars of an embodiment. In some cases, the worst-case voltage stress duration for the H and F cells may be the same (i.e., the circles representing the H and F cells may overlap).

In one embodiment, the selective page refresh operation may involve rewriting one or more pages connected to a particular word line associated with a particular page to be programmed. In one example, a particular word line may be associated with a first page and a second page. If a programming operation is to be performed on the first page and it is determined that the first and second pages have been programmed more than a threshold number of times, then both the first and second pages may be programmed to refresh the memory cells. In another embodiment, refreshing the second page and/or portions of the first page that are not being programmed may be performed only when a data error is detected. In one example, if a programming operation is to be performed on the first page, then both the first page and the second page connected to the shared word line will be pre-read and stored in a memory buffer. After pre-reading the first and second pages, the first page may then be programmed with new data and the first and second pages may be verified in order to determine if any data errors occurred in either the first page or the second page during the programming of the new data into the first page. If a data error is detected, then the buffered data for both the first and second pages may be rewritten.

Referring to FIG. 7B, the distribution associated with the F cells crosses the line 704 implying that some number of disturb failures will occur. In some cases, ECC codes may be used to detect and correct the disturb failures caused by this overlap. One way to remove the overlap would be to increase the rate at which memory array refresh operations occur. During a memory array refresh operation, an entire memory array may be refreshed by, for example, moving the entire memory array contents to a new memory array and erasing the original memory array to be used at a later time.

Referring to FIG. 7B, the U cells may be stressed much longer than the S, H, and F cells and therefore the voltage difference across the U cells may be much lower than the voltage differences experience by the S, H, and F cells. The particular memory array biasing scheme depicted in FIG. 7B shows that the voltage difference across the U cells is 0V.

Because of the large number of U cells, the voltage stress associated with the U cells may also be limited in order to reduce the amount of current, power, or energy required during a read or write operation.

Figure 7C:
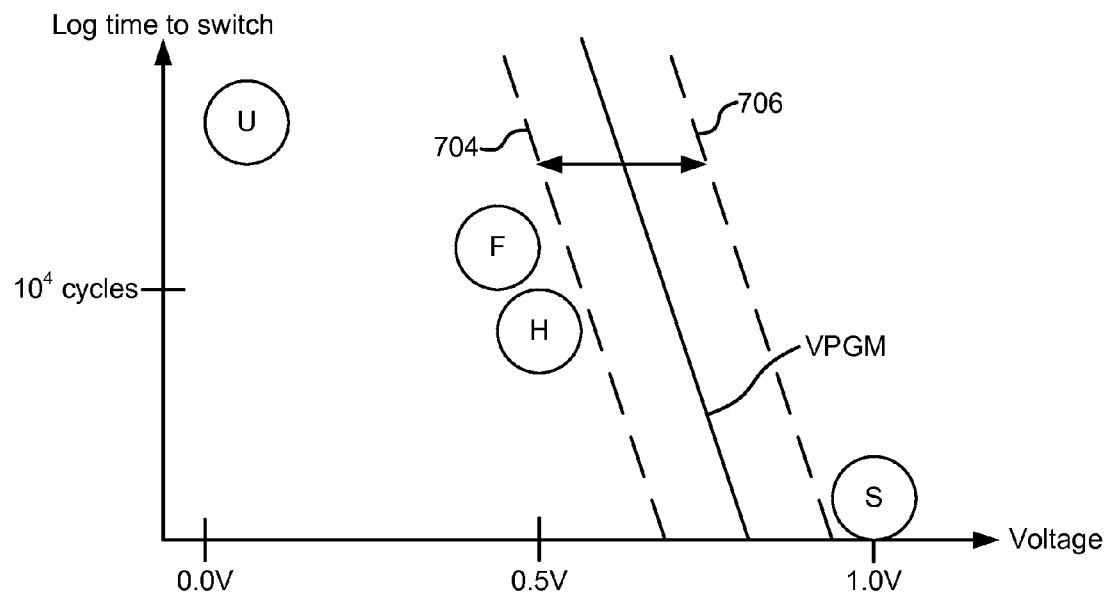
FIG. 7C depicts a graph of the time for a memory cell to switch given the first temperature used in FIG. 7B over a voltage difference across the memory cell.

FIG. 7C depicts a graph of the time for a memory cell to switch given the first temperature used in FIG. 7B (e.g., room temperature) over a voltage difference across the memory cell. The graph of FIG. 7C is similar to the graph of FIG. 7B, but with a shift in the distributions for the four types of memory cells (S, H, F, and U cells) represented. As depicted, a new memory array biasing scheme has been used to shift the F cell distribution to a lower voltage stress at the expense of increasing the voltage stress experienced by the U cells. In one example, the memory array may be biased such that the selected bit lines are biased to 0V, the unselected word lines are biased to 0.45V, the selected word line is biased to 1V, and the unselected bit line is biased to 0.5V.

Figure 7D:
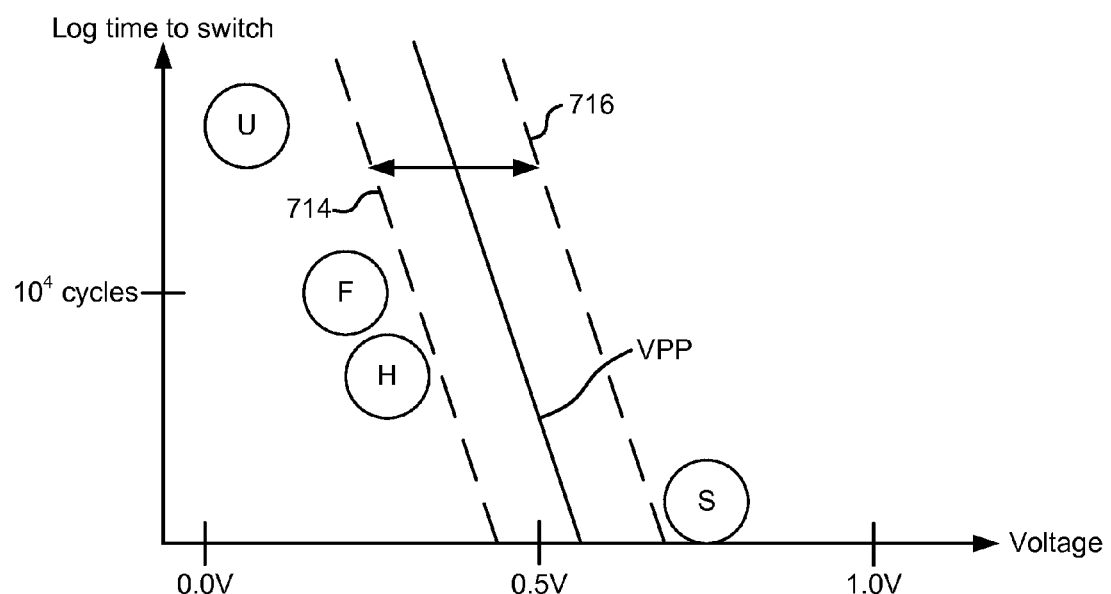
FIG. 7D depicts a graph of the time for a memory cell to switch given a second temperature greater than the first temperature of FIG. 7A over a voltage difference across the memory cell.

FIG. 7D depicts a graph of the time for a memory cell to switch given a second temperature (e.g., 85 degrees Celsius) greater than the first temperature of FIG. 7A over a voltage difference across the memory cell. In one embodiment, the first temperature of FIG. 7A corresponds with a maximum operating temperature for a memory array and the second temperature corresponds with a minimum operating temperature for a memory array. Thus, in the worst-case, the range of programming voltages will vary between those described by line 706 (i.e., the maximum programming voltages) and by line 714 (i.e., the minimum programming voltages).

Referring to FIG. 7D, in order to program the S cells, a programming voltage greater than or equal to the voltages associated with line 716 must be applied to the S cells. In order to not disturb (i.e., not program) the F cells, the voltage difference across F cells must be less than the voltages associated with line 714. Depending on the array architecture, H and F cells may experience similar voltage stress times and therefore the maximum voltage stress allowed across the F cells may also be the maximum voltage stress allowed across the H cells. In other cases, the H and F cells may experience different voltage stress times and therefore the maximum voltage stress allowed across the F cells may be different from the maximum voltage stress allowed across the H cells. In order to not program or disturb the U cells, the voltage difference across U cells must also be less than the voltages associated with line 714. The voltage difference across the U cells may be less than the voltage difference across the F cells because the amount of time during which the U cells are stressed may be greater than the amount of time during which the F cells are stressed.

Figure 7E:
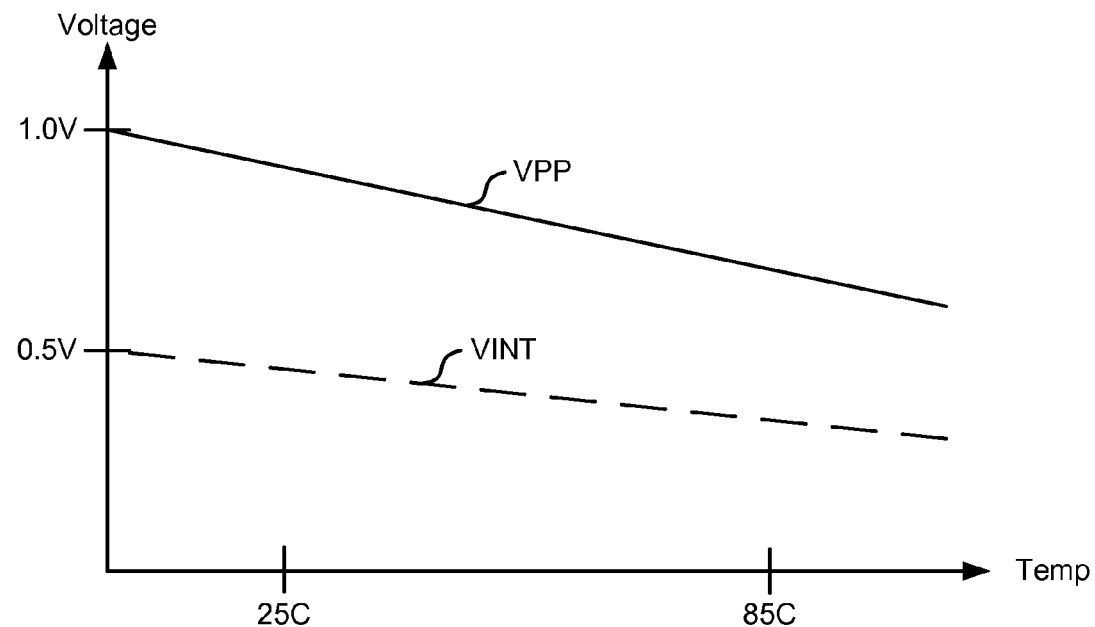
FIG. 7E depicts a graph of a selected word line voltage and an unselected word line voltage over temperature.

FIG. 7E depicts a graph of a selected word line voltage (VPP) and an unselected word line voltage (VINT) over temperature. As depicted, both the selected word line voltage (e.g., the programming voltage or reading voltage) and the unselected word line voltage may decrease linearly with increasing temperature. In some embodiments, VPP and/or VINT may decrease non-linearly with increasing temperature. In one embodiment, a temperature dependent reference may be used to generate the VPP and VINT voltages. More information regarding temperature dependent references can be found in U.S. Pat. No. 7,057,958, "Method and System for Temperature Compensation for Memory Cells with Temperature-Dependent Behavior," incorporated herein by reference in its entirety.

In another embodiment, temperature dependent reference voltages, such as VPP and VINT, may be generated using a temperature sensor and control logic. The control logic may acquire temperature information from the temperature sensor and look up a corresponding reference voltage (e.g., stored in a non-volatile memory) based on the temperature information. The control logic may control one or more voltage reference generators for generating selected and/or unselected control line voltages by modifying trimming options associated with the output voltages of the one or more voltage reference generators. In some cases, the output voltages of a particular voltage reference generator may be a non-linear function of temperature.

Figure 7F:
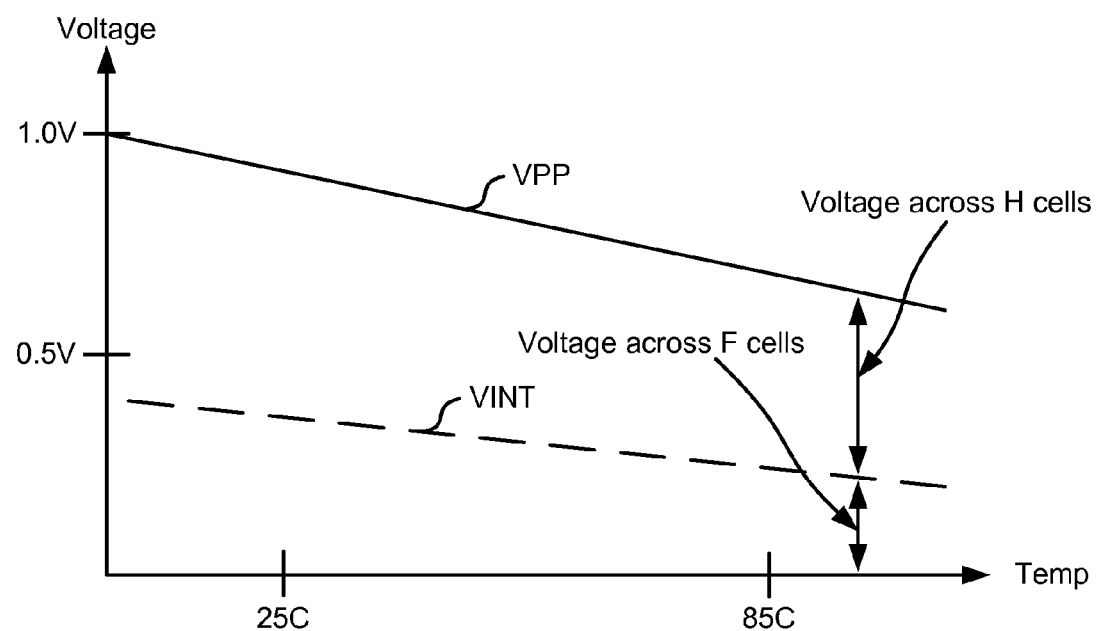
FIG. 7F depicts a graph of a selected word line voltage and unselected word line voltage over temperature.

FIG. 7F depicts a graph of a selected word line voltage and unselected word line voltage over temperature. As depicted, the unselected word line voltage (VINT) is set such that the voltage across the F cells is less than the voltage across the H cells. In some embodiments, the difference between the voltage across the F cells and the voltage across the H cells may be dynamically adjusted based on temperature and/or one or more array conditions such as the number of bits along the selected word line simultaneously programmed, or the number of write cycles per page or per memory array. In some cases, during a programming operation, both S memory cells and H memory cells connected to a selected word line may be verified and corrected for errors caused by the programming operation. As correcting for program disturbs occurring to H cells may be more efficient than correcting for program disturbs occurring to F cells, the voltage across the H cells may be increased so that the voltage across the F cells may be decreased. Thus, a trade-off may be made between the voltage stress across the H cells and the voltage stress across the F cells such that the F cells are better protected from program disturb because disturb of the H cells may be easier to detect and correct. In other cases, such as the desire to have a word line with highly disturb resistant programming or word lines that can have a larger number of programming cycles before refreshing the cells, the voltage across the F cells may be increased so that the voltage across the H cells is less than the voltage across the F cells.

Figure 8A:
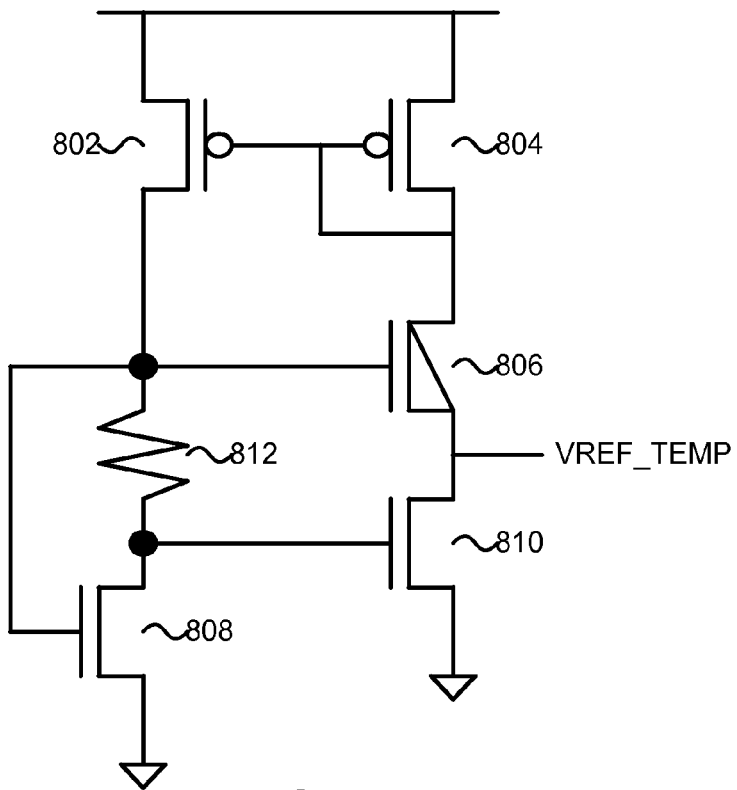
FIG. 8A depicts one embodiment of a voltage reference generator.

FIG. 8A depicts one embodiment of a voltage reference generator including transistors 802-810 and resistor 812. Transistors 808 and 810 comprise high VT nMOS transistors. Transistors 802 and 804 comprise pMOS transistors in a current mirror configuration. Transistor 806 comprises a low VT nMOS transistor. As depicted, the voltage reference generator generates and combines a proportional to absolute temperature (PTAT) voltage and a complementary to absolute temperature (CTAT) voltage based on a difference in transistor VTs between transistor 808 and transistor 806. By modifying the degree to which the PTAT voltage and the CTAT voltage are combined, a resulting output voltage may be created that is either PTAT or CTAT. In one embodiment, the devices are sized such that VREF_TEMP provides a CTAT voltage. Resistor and transistor trimming options may be used to modify the resulting output voltage and its slope over temperature. One benefit of using a voltage reference generator based on a difference in transistor VTs is that, unlike voltage references based on the base-emitter voltage of a bipolar junction transistor (e.g., a bandgap voltage reference), reference voltages may be generated over a wide range of temperatures using a sub-1V voltage supply. More information regarding voltage reference generation can be found in U.S. Pat. No. 7,999,529, "Methods and Apparatus for Generating Voltage References Using Transistor Threshold Differences," incorporated herein by reference in its entirety.

Figure 8B:
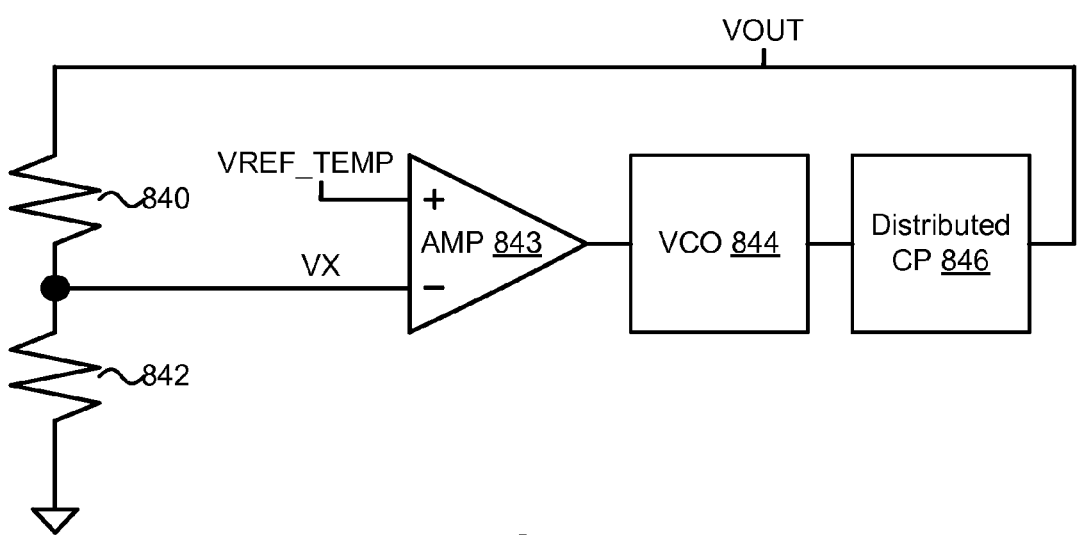
FIG. 8B depicts one embodiment of a voltage generator for generating voltages greater than a provided voltage supply.

FIG. 8B depicts one embodiment of a voltage generator for generating voltages greater than a provided voltage supply. As depicted, VREF_TEMP is used as an input to amplifier AMP 843. Due to closed-loop feedback, the voltage at node VX will be close to VREF_TEMP and the voltage at node VOUT will be a multiplier higher than the voltage at node VX due to the voltage divider formed by resistors 840 and 842. The amplifier AMP843 drives a voltage controlled oscillator VCO 844. VCO 844 drives one or more distributed charge pumps 846 that generate voltages higher than the supply voltage provided. Resistor and transistor trimming options may be used to modify the resulting output voltage VOUT and its slope over temperature. In one embodiment, the VPP and VINT voltages of FIG. 7F may be generated using the circuits depicted in FIG. 8A and FIG. 8B using a supply voltage that may lie in a range from 5 volts to 0.5 volts. Even higher or lower voltages may be used. In one embodiment, a supply voltage of about 1.5 volts is used.

Figure 9A:
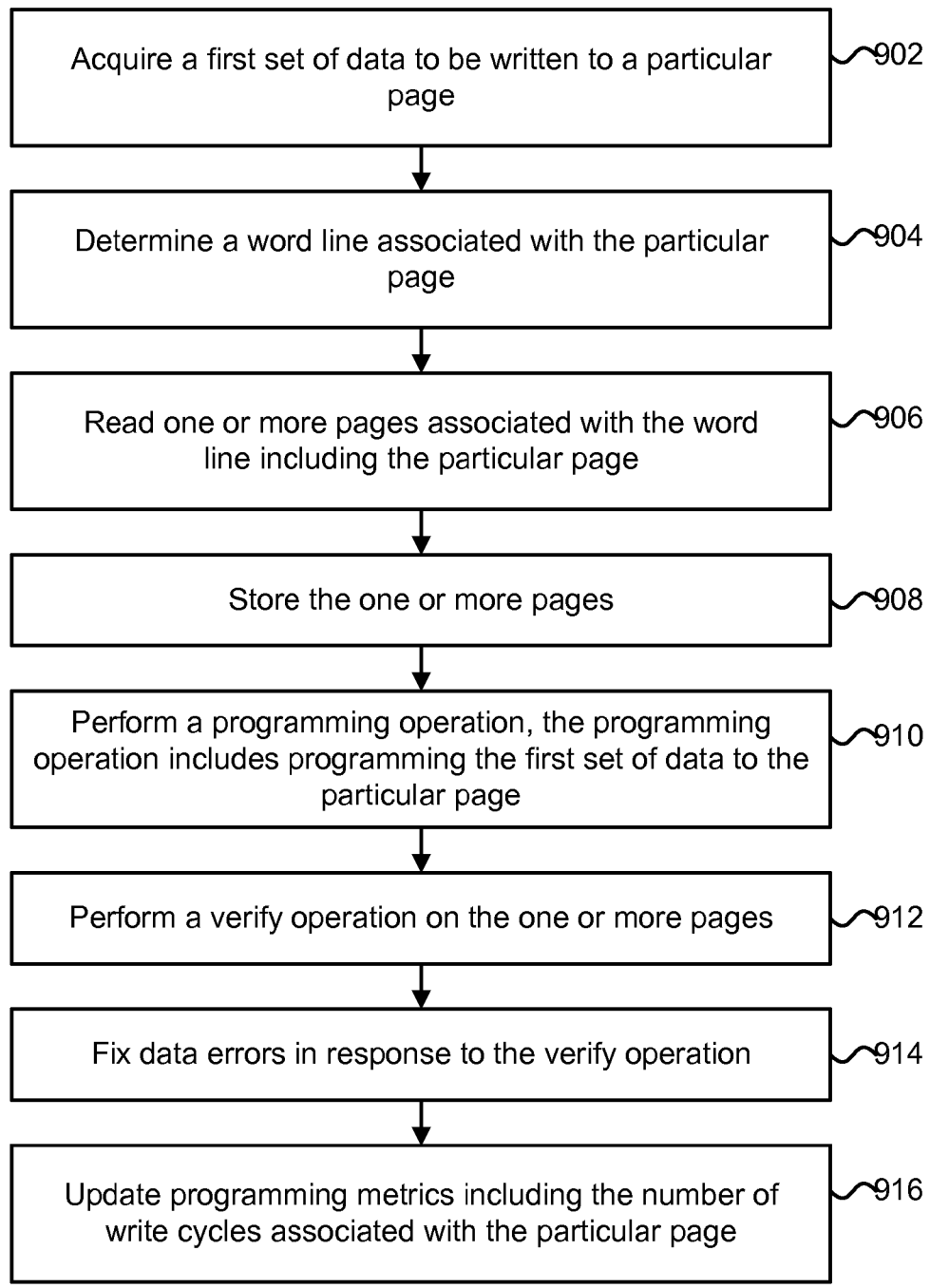
FIG. 9A is a flowchart describing one embodiment of a process for performing a programming sequence.

FIG. 9A is a flowchart describing one embodiment of a process for performing a programming sequence including a programming operation and a verify operation. In one embodiment, the process of FIG. 9A is performed by a memory chip, such as memory chip 102 in FIG. 1.

In step 902, a first set of data to be written to a particular page is acquired. The particular page may correspond with a particular memory address to which the first set of data is to be written. In step 904, a word line associated with the particular page is determined. In step 906, one or more pages associated with the word line are read. The one or more pages may include the particular page. In step 908, the one or more pages read in step 906 are stored. The one or more pages may be stored in a distributed page register or other memory buffer. By reading and storing the one or more pages, data errors occurring in the one or more pages caused during a programming operation may be detected and/or corrected.

In step 910, a programming operation is performed. The programming operation includes programming the first set of data to the particular page. One embodiment of a process for performing a programming operation is described later in reference to FIG. 9B. In some cases, the number of memory cells programmed at the same time during a programming operation may be a function of temperature. For example, at temperatures higher than a particular threshold, the number of memory cells programmed at the same time may be reduced. In step 912, a verify operation is performed on the one or more pages. The verify operation may include comparing data read from the particular page after programming the particular page with data stored in the memory buffer in step 908. In step 914, data errors are fixed in response to the verify operation of step 912. The data errors may be fixed by rewriting the entire page again or only rewriting portions of the page in which the data errors were detected. In step 916, programming metrics are updated. The programming metrics may include the current number of write cycles associated with the particular page or the current number of write cycles associated with a memory array or block in which the particular page exists. In some cases, the programming metrics may include the current number of write cycles associated with a particular word line to which the particular page is associated.

Figure 9B:
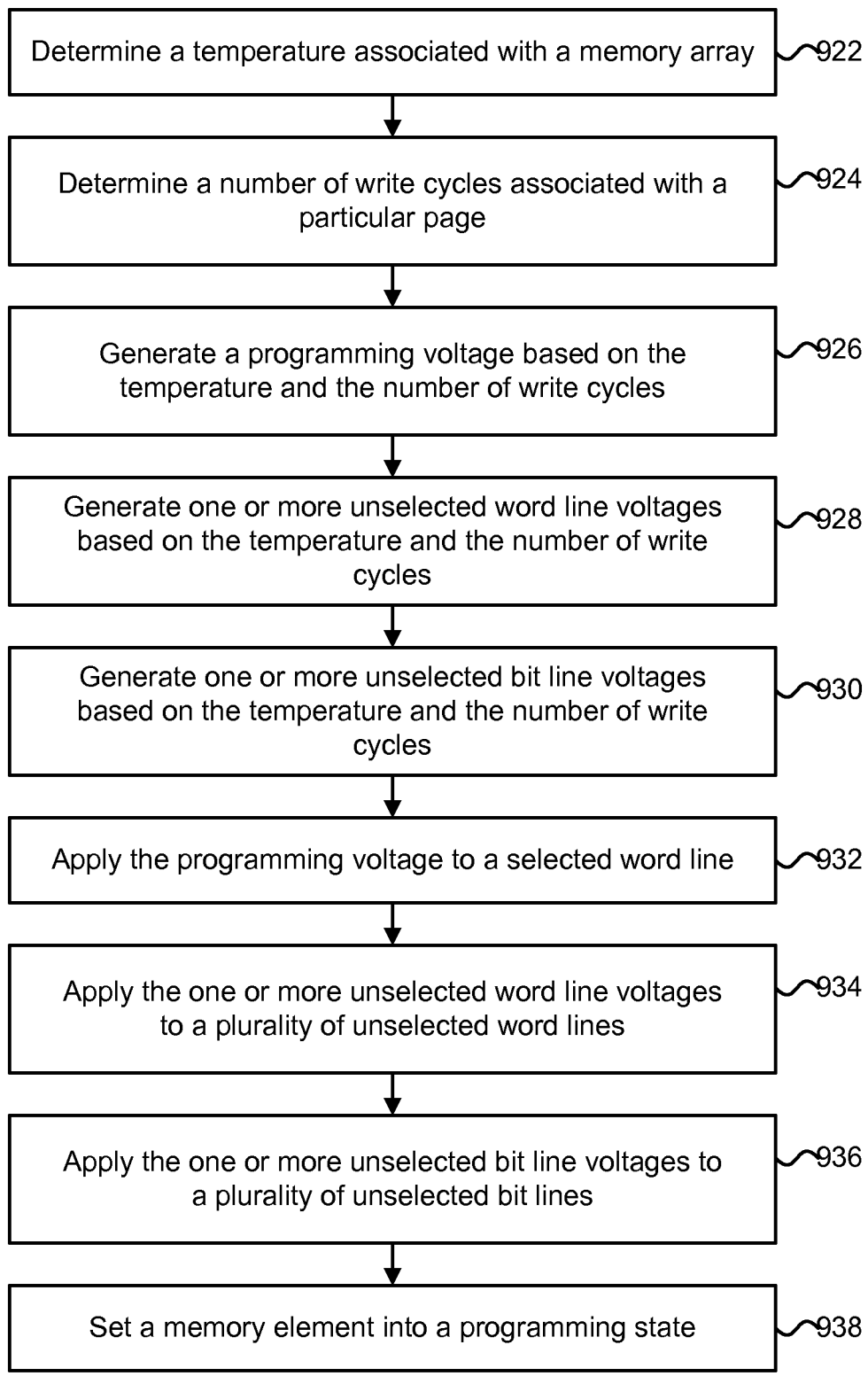
FIG. 9B is a flowchart describing one embodiment of a process for performing a programming operation.

FIG. 9B is a flowchart describing one embodiment of a process for performing a programming operation. The process described in FIG. 9B is one example of a process for implementing step 910 in FIG. 9A. In one embodiment, the process of FIG. 9B is performed by a memory chip, such as memory chip 102 in FIG. 1.

In step 922, a temperature associated with a memory array is determined. The temperature may be determined using a temperature sensor. The temperature sensor may be integrated on the memory chip in which the memory array exists. In step 924, a number of write cycles associated with a particular page is determined. The number of write cycles associated with the particular page may be acquired from sideband information (or other overhead information) associated with the particular page.

In step 926, a programming voltage based on the temperature and the number of write cycles is generated. In step 928, one or more unselected word line voltages are generated based on the temperature and the number of write cycles. In step 930, one or more unselected bit line voltages are generated based on the temperature and the number of write cycles. The voltages generated in steps 926-930 may be generated using voltage generation circuitry such as the voltage generation circuits described in reference to FIGS. 8A-8B. In one embodiment, a bandgap voltage reference may be used to provide a stable voltage reference over temperature and the voltages generated in steps 926-930 may be based on values located in a lookup table stored in nonvolatile memory. In another embodiment, a voltage reference based on the difference in transistor VTs may be used to provide either a stable voltage reference over temperature or a temperature dependent voltage reference.

In some embodiments, the voltages generated in steps 926-930 may depend on the particular memory layer (or layers) in which a particular page exists. The programming variability of memory cells in a memory array may depend upon the memory layer in which the memory cells exist. In some cases, this variability may be caused by varying thicknesses per memory layer of deposited materials composing the memory cells. To compensate for memory cell programming variability over memory layers, the voltages generated in steps 926-930 may be generating taking into account trimming information stored in a non-volatile memory. The trimming information may be determined by measuring the programming characteristics of test memory cells on each memory layer of a memory array. The trimming information may be programmed into the non-volatile memory prior to performing operations on the memory array (e.g., during wafer sort).

In some embodiments, the voltages generated in steps 926-930 may be generated such that a first voltage difference between one or more unselected first control line voltages (e.g., one or more unselected word line voltages) and a selected second control line voltage (e.g., a selected bit line voltage) is less than a second voltage difference between a selected first control line voltage (e.g., a selected word line voltage) and one or more unselected second control line voltages (e.g., one or more unselected bit line voltages). The first voltage difference may be less than the second voltage difference by a particular amount. The particular amount may be based on a particular number of write cycles that have occurred since a last erase of the memory array. The particular amount may be based on a particular number of page writes that have occurred since a last refresh of a particular page (or word line associated with the particular page). The particular amount may be based on a temperature associated with the memory array.

In step 932, the programming voltage is applied to a selected word line. In step 934, the one or more unselected word line voltages are applied to a plurality of unselected word lines. In step 936, the one or more unselected bit line voltages are applied to a plurality of unselected bit lines. In step 938, a memory element associated with the selected word line and a selected bit line is set into a programming state. The memory element may be set into the programming state in response to applying the programming voltage to the selected word line and applying a selected bit line voltage to the selected bit line. In some embodiments, the memory element may be set into a programming state in response to applying the programming voltage to the selected bit line instead of applying the programming voltage to the selected word line. In one embodiment, step 934 precedes 936 which precedes step 932. In another embodiment, step 934 and step 936 occur substantially at the same time and both precede step 932. In other embodiments, any possible order of applying steps 932, 934 and 936 may be used.

Figure 9C:
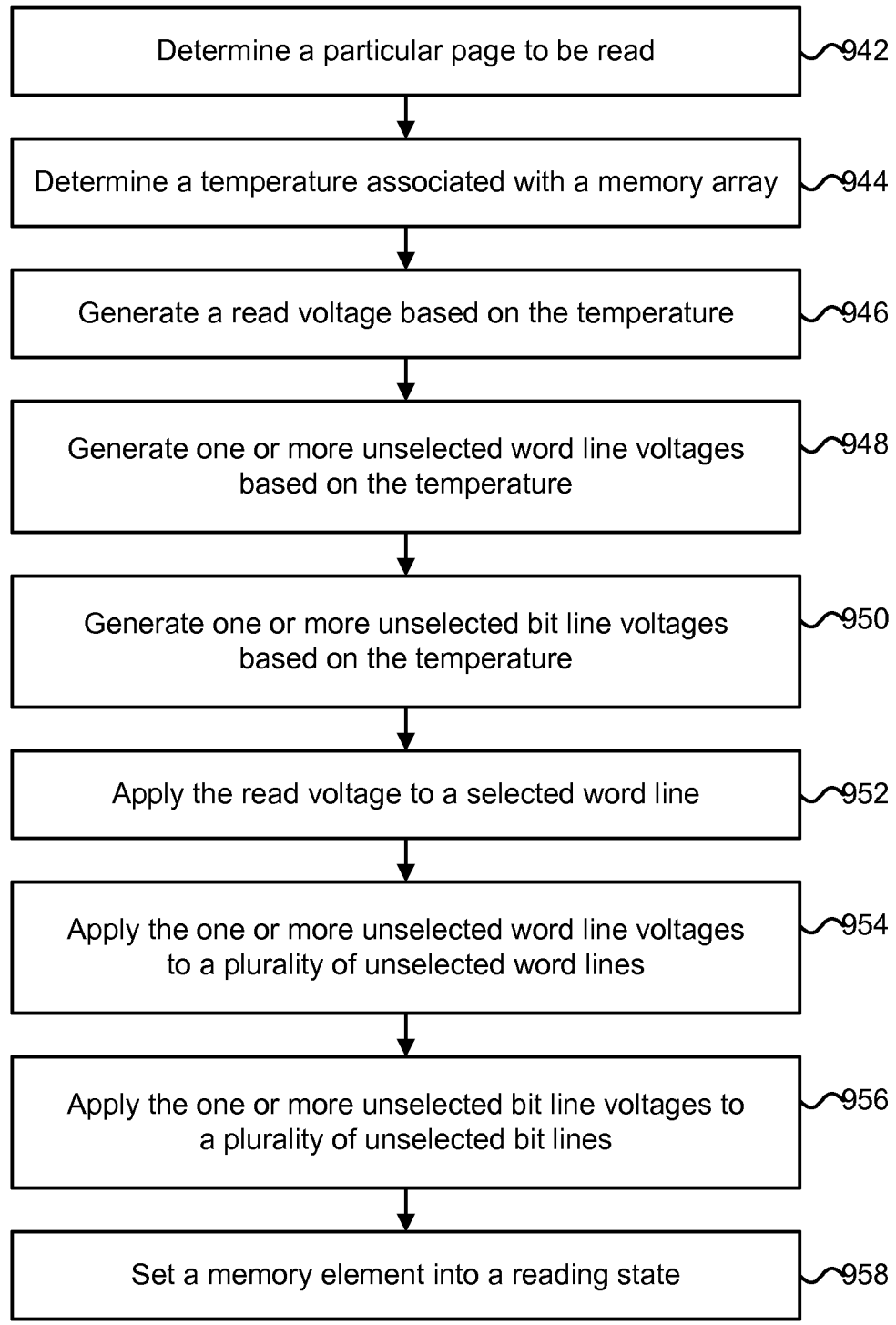
FIG. 9C is a flowchart describing one embodiment of a process for performing a reading operation.

FIG. 9C is a flowchart describing one embodiment of a process for performing a reading operation. In one embodiment, the process of FIG. 9C is performed by a memory chip, such as memory chip 102 in FIG. 1.

In step 942, a particular page to be read is determined. The particular page may be determined based on a read instruction and a read address provided to the memory array from memory core control circuits, such as memory core control circuits 104 in FIG. 1. In step 944, a temperature associated with a memory array is determined. The memory array includes the particular page. In step 946, a read voltage is generated based on the temperature. In step 948, one or more unselected word line voltages are generated based on the temperature. In step 950, one or more unselected bit line voltages are generated based on the temperature.

The voltages generated in steps 946-950 may be generated using voltage generation circuitry such as the voltage generation circuits described in reference to FIGS. 8A-8B. In one embodiment, a bandgap voltage reference may be used to provide a stable voltage reference over temperature and the voltages generated in steps 946-950 may be based on values located in a lookup table stored in nonvolatile memory. In another embodiment, a voltage reference based on a difference in transistor VTs may be used to provide either a stable voltage reference over temperature or a temperature dependent voltage reference.

In some embodiments, the voltages generated in steps 946-950 may be generated such that a first voltage difference between the one or more unselected word line voltages and a selected bit line voltage is less than a second voltage difference between the selected word line voltage and the one or more unselected bit line voltages. The first voltage difference may be less than the second voltage difference by a particular amount. The particular amount may be based on a temperature associated with the memory array. In some embodiments, the first voltage difference may be substantially zero.

In step 952, the read voltage is applied to a selected word line. In step 954, the one or more unselected word line voltages are applied to a plurality of unselected word lines. In step 956, the one or more unselected bit line voltages are applied to a plurality of unselected bit lines. In one embodiment, steps 954 and 956 both precede step 952. In step 958, a memory element associated with the selected word line and a selected bit line is set into a reading state and the state of the resistive memory element is sensed. The memory element may be set into the reading state in response to applying the read voltage to the selected word line and applying a selected bit line voltage to the selected bit line. In some embodiments, the memory element may be set into a reading state in response to applying the read voltage to the selected bit line instead of applying the read voltage to the selected word line.

Figure 9D:
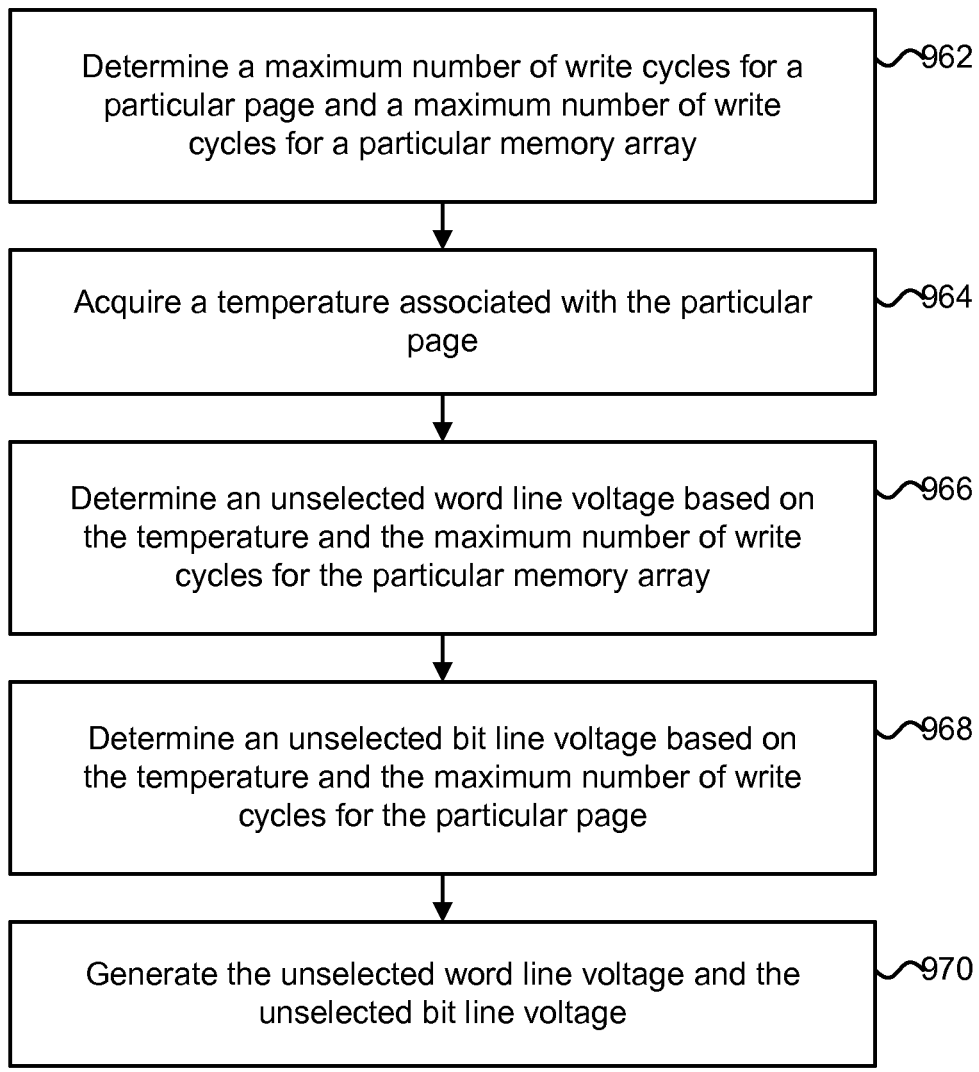
FIG. 9D is a flowchart describing one embodiment of a process for generating unselected control line voltages.

FIG. 9D is a flowchart describing one embodiment of a process for generating unselected control line voltages. The process described in FIG. 9D is one example of a process for implementing step 928 in FIG. 9B and for implementing step 948 in FIG. 9C. In one embodiment, the process of FIG. 9D is performed by a memory chip, such as memory chip 102 in FIG. 1.

In step 962, a maximum number of write cycles for a particular page and a maximum number of write cycles for a particular memory array are determined. In step 964, a temperature associated with the particular page is acquired. In step 966, an unselected word line voltage based on the temperature and the maximum number of write cycles for the particular memory array is determined. In step 968, an unselected bit line voltage based on the temperature and the maximum number of write cycles for the particular page is determined. In step 970, the unselected word line voltage determined in step 966 and the unselected bit line voltage determined in step 968 are generated.

Figure 9E:
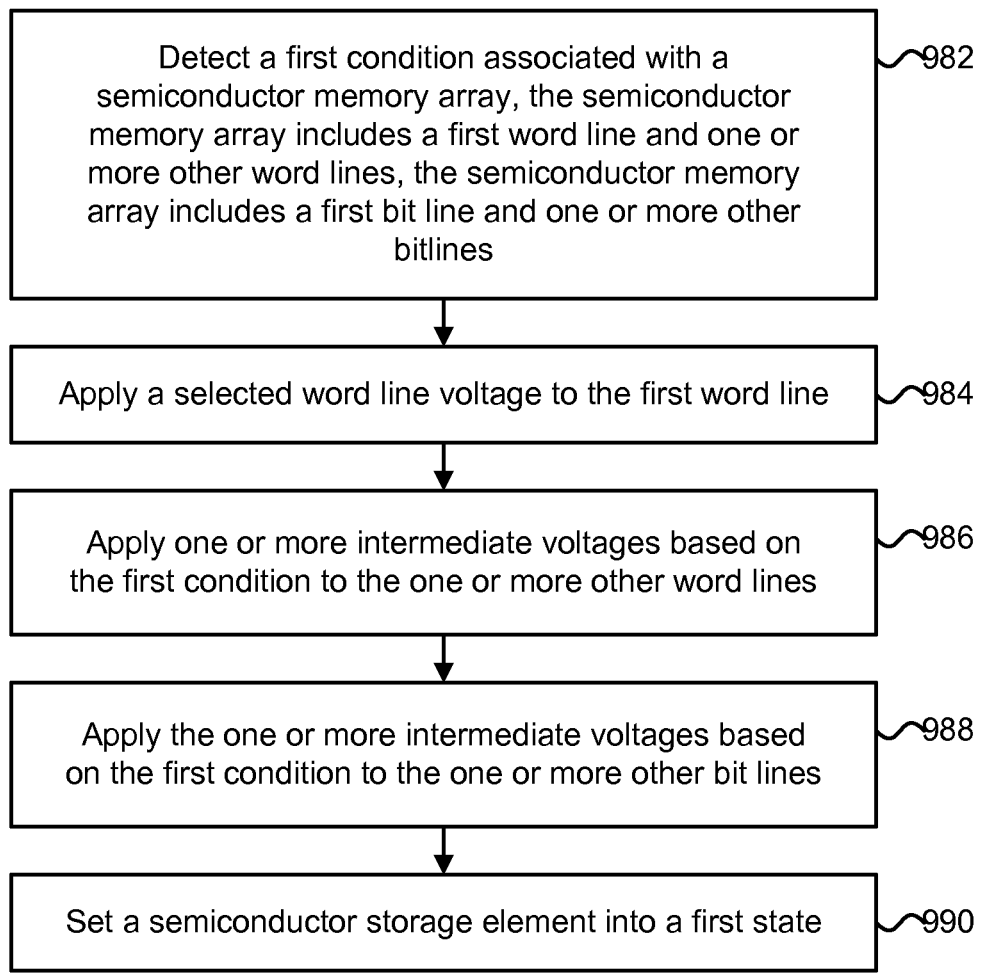
FIG. 9E is a flowchart describing one embodiment of a process for performing a memory array operation.

FIG. 9E is a flowchart describing one embodiment of a process for performing a memory array operation. The process described in FIG. 9E is one example of a process for implementing step 910 in FIG. 9A. In one embodiment, the process of FIG. 9E is performed by a memory chip, such as memory chip 102 in FIG. 1.

In step 982, a first condition associated with a semiconductor memory array is detected. The semiconductor memory array may include a first word line and one or more other word lines. The semiconductor memory array may also include a first bit line and one or more other bit lines. In one embodiment, the first condition may include detecting a particular temperature associated with the semiconductor memory array. In some embodiments, the first condition may include detecting a particular number of write cycles associated with the memory array or a particular number of write cycles associated with a particular page within the memory array. As the number of write cycles increases, selected control line voltages (e.g., the selected word line voltage) and unselected control line voltages (e.g., one or more unselected word line voltages) may be dynamically adjusted based on the number of write cycles and/or the particular temperature. In one example, the selected control line voltages and the unselected control line voltages may be reduced in order to limit the amount of program disturb caused by the number of write cycles. In another example, the voltage stresses associated with H cells and F cells may be dynamically shifted over temperature and the number of write cycles.

In step 984, a selected word line voltage is applied to the first word line. In step 986, one or more intermediate voltages based on the first condition are applied to the one or more other word lines. In step 988, the one or more intermediate voltages based on the first condition are applied to the one or more other bit lines. In one embodiment, steps 986 and 988 both precede step 984. The one or more intermediate voltages may be generating using a temperature dependent reference or other circuit for generating reference voltages that vary over temperature. In step 990, a semiconductor storage element of the semiconductor memory array is set into a first state. The first state may comprise a programming state or a reading state.

One embodiment of the disclosed technology includes acquiring a temperature associated with a semiconductor memory array. The semiconductor memory array includes a first set of control lines arranged in a first direction and a second set of control lines arranged in a second direction. The first set of control lines includes a first particular control line and a plurality of other first control lines. The second set of control lines includes a second particular control line and a plurality of other second control lines. The semiconductor memory array includes a first semiconductor storage element disposed between the first particular control line and the second particular control line. The method further includes applying a selected first control line voltage to the first particular control line, applying a selected second control line voltage to the second particular control line, applying one or more unselected first control line voltages based on the temperature to the plurality of other first control lines, applying one or more unselected second control line voltages based on the temperature to the plurality of other second control lines, and setting the first semiconductor storage element into a first state in response to the applying a selected first control line voltage and the applying a selected second control line voltage.

One embodiment of the disclosed technology includes detecting a first condition associated with the semiconductor memory array. The detecting a first condition includes at least one of detecting a particular temperature associated with the semiconductor memory array or detecting a particular number of write cycles associated with the semiconductor memory array. The semiconductor memory array includes a plurality of word lines arranged in a first direction and a plurality of bit lines arranged in a second direction. The plurality of word lines includes a first word line and one or more other word lines. The plurality of bit lines includes a first bit line and one or more other bit lines. The semiconductor memory array includes a first semiconductor storage element disposed between the first word line and the first bit line. The method further includes applying a selected word line voltage to the first word line, applying one or more intermediate voltages based on the first condition to the one or more other word lines and the one or more other bit lines, and setting the first semiconductor storage element into a first state in response to the applying a selected word line voltage.

One embodiment of the disclosed technology includes a semiconductor memory array, a first voltage reference circuit, a second voltage reference circuit, and one or more managing circuits. The semiconductor memory array includes a plurality of word lines arranged in a first direction and a plurality of bit lines arranged in a second direction. The plurality of word lines includes a first word line and one or more other word lines. The plurality of bit lines includes a first bit line and one or more other bit lines. The semiconductor memory array includes a first semiconductor storage element disposed between the first word line and the first bit line. The first voltage reference circuit generates one or more intermediate voltages based on a temperature associated with the semiconductor memory array. The second voltage reference circuit generates a selected word line voltage based on the temperature. The one or more managing circuits bias the one or more other word lines to the one or more intermediate voltages, bias the one or more other bit lines to the one or more intermediate voltages, bias the first word line to the selected word line voltage, and bias the first bit line to a selected bit line voltage.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for operating a non-volatile semiconductor memory array, comprising:

acquiring a temperature associated with the semiconductor memory array, the semiconductor memory array comprises a cross-point memory array and includes a first set of control lines arranged in a first direction and a second set of control lines arranged in a second direction, the first set of control lines includes a first particular control line and a plurality of other first control lines, the second set of control lines includes a second particular control line and a plurality of other second control lines, the semiconductor memory array includes a first semiconductor storage element disposed between the first particular control line and the second particular control line;

applying a selected first control line voltage to the first particular control line;

applying a selected second control line voltage to the second particular control line;

applying one or more unselected first control line voltages based on the temperature to the plurality of other first control lines;

applying one or more unselected second control line voltages based on the temperature to the plurality of other second control lines; and setting the first semiconductor storage element into a first state in response to the applying a selected first control line voltage and the applying a selected second control line voltage.

2. The method of claim 1, wherein:

the first state is associated with a programming state of the first semiconductor storage element; and the selected first control line voltage is associated with a programming voltage of the first semiconductor storage element.

3. The method of claim 1, further comprising:

generating the one or more unselected first control line voltages prior to the applying one or more unselected first control line voltages, the generating the one or more unselected first control line voltages includes generating the one or more unselected first control line voltages such that a first voltage difference between the one or more unselected first control line voltages and the selected second control line voltage is less than a second voltage difference between the selected first control line voltage and the one or more unselected second control line voltages.

4. The method of claim 3, further comprising:

determining a particular number of write cycles associated with the semiconductor memory array, the generating the one or more unselected first control line voltages includes generating the one or more unselected first control line voltages such that the first voltage difference between the one or more unselected first control line voltages and the selected second control line voltage is less than the second voltage difference between the selected first control line voltage and the one or more unselected second control line voltages by a particular amount, the particular amount is based on the particular number of write cycles.

5. The method of claim 4, wherein:

the determining a particular number of write cycles includes determining a number of write cycles that have occurred since a last erase of the semiconductor memory array.

6. The method of claim 3, further comprising:

determining a particular number of write cycles associated with a page within the semiconductor memory array, the page is associated with the first particular control line, the generating the one or more unselected first control line voltages includes generating the one or more unselected first control line voltages such that the first voltage difference between the one or more unselected first control line voltages and the selected second control line voltage is less than the second voltage difference between the selected first control line voltage and the one or more unselected second control line voltages by a particular amount, the particular amount is based on the particular number of write cycles.

7. The method of claim 6, wherein:

the determining a particular number of write cycles includes determining a number of write cycles that have occurred since a last refresh of the page.

8. The method of claim 3, wherein:

the generating one or more unselected first control line voltages is performed by a voltage generation circuit that generates voltages that are complementary to absolute temperature.

9. The method of claim 1, wherein:

the first state is associated with a reading state of the first semiconductor storage element; and the selected first control line voltage is associated with a reading voltage of the first semiconductor storage element.

10. The method of claim 1, wherein:

the one or more unselected first control line voltages are greater than the selected second control line voltage and less than the selected first control line voltage; and the one or more unselected second control line voltages are greater than the selected second control line voltage and less than the selected first control line voltage.

11. The method of claim 1, further comprising:

floating at least a portion of the plurality of other second control lines prior to the applying a selected first control line voltage.

12. The method of claim 1, wherein:

the second set of control lines comprises vertically oriented bit lines.

13. The method of claim 1, wherein:

the first set of control lines comprises word lines; and
the second set of control lines comprises bit lines.

14. The method of claim 1, wherein:

the first semiconductor storage element comprises a non-volatile storage element.

15. The method of claim 1, wherein:

the first semiconductor storage element includes a conductive bridge memory element.

16. The method of claim 1, wherein:

the first semiconductor storage element includes a memory element in series with a steering element.

17. The method of claim 16, wherein:

the steering element comprises a diode.

18. The method of claim 1, wherein:

the acquiring a temperature associated with the semiconductor memory array includes sensing the temperature using a temperature sensor.

19. A method for operating a non-volatile semiconductor memory array, comprising:

detecting a first condition associated with the semiconductor memory array, the semiconductor memory array comprises a cross-point memory array, the detecting a first condition includes at least one of detecting a particular temperature associated with the semiconductor memory array or detecting a particular number of write cycles associated with the semiconductor memory array, the semiconductor memory array includes a plurality of word lines arranged in a first direction and a plurality of bit lines arranged in a second direction, the plurality of word lines includes a first word line and one or more other word lines, the plurality of bit lines includes a first bit line and one or more other bit lines, the semiconductor memory array includes a first semiconductor storage element disposed between the first word line and the first bit line;

applying a selected word line voltage to the first word line;

applying one or more intermediate voltages based on the first condition to the one or more other word lines and the one or more other bit lines; and setting the first semiconductor storage element into a first state in response to the applying a selected word line voltage.

20. The method of claim 19, further comprising:
applying a selected bit line voltage to the first bit line; and
generating the one or more intermediate voltages prior to the applying one or more intermediate voltages, the generating the one or more intermediate voltages includes generating the one or more intermediate voltages such that a first voltage difference between the one or more intermediate voltages and the selected bit line voltage is less than a second voltage difference between the selected word line voltage and the one or more intermediate voltages by a particular amount, the particular amount is based on the first condition.

21. The method of claim 20, further comprising:
detecting a second condition associated with the semiconductor memory array subsequent to the detecting a first condition; and
applying one or more second intermediate voltages based on the second condition to the one or more other word lines and the one or more other bit lines, the applying one or more second intermediate voltages is performed subsequent to the applying one or more intermediate voltages, the one or more second intermediate voltages are different from the one or more intermediate voltages.

22. The method of claim 19, wherein:
the detecting a particular number of write cycles includes determining a number of write cycles that have occurred since a last erase of the semiconductor memory array.

23. The method of claim 19, wherein:
the semiconductor memory array includes a page associated with the first word line, the detecting a particular number of write cycles includes determining a number of write cycles that have occurred since a last refresh of the page.

24. The method of claim 19, wherein:
the one or more intermediate voltages are greater than the selected bit line voltage and less than the selected word line voltage.

25. The method of claim 19, wherein:
the first state is associated with a programming state of the first semiconductor storage element; and
the selected word line voltage is associated with a programming voltage of the first semiconductor storage element.

26. The method of claim 20, wherein:
the generating the one or more intermediate voltages is performed by a voltage generation circuit that generates voltages that are dynamically adjusted complementary to absolute temperature changes.

27. The method of claim 19, further comprising:
floating the one or more other bit lines prior to the applying a selected word line voltage.

28. The method of claim 19, wherein:
the plurality of bit lines comprises vertically oriented bit lines.

29. The method of claim 19, wherein:
the first semiconductor storage element comprises a non-volatile storage element.

30. The method of claim 19, wherein:
the first semiconductor storage element includes a conductive bridge memory element.

31. A non-volatile storage system, comprising:
a semiconductor memory array, the semiconductor memory array comprises a cross-point memory array and includes a plurality of word lines arranged in a first direction and a plurality of bit lines arranged in a second direction, the plurality of word lines includes a first word line and one or more other word lines, the plurality of bit lines includes a first bit line and one or more other bit lines, the semiconductor memory array includes a first semiconductor storage element disposed between the first word line and the first bit line;
a first voltage reference circuit, the first voltage reference circuit generates one or more intermediate voltages based on a temperature associated with the semiconductor memory array;
a second voltage reference circuit, the second voltage reference circuit generates a selected word line voltage based on the temperature; and
one or more managing circuits in communication with the plurality of word lines and the plurality of bit lines, the one or more managing circuits bias the one or more other word lines to the one or more intermediate voltages and bias the one or more other bit lines to the one or more intermediate voltages, the one or more managing circuits bias the first word line to the selected word line voltage and bias the first bit line to a selected bit line voltage.

32. The non-volatile storage system of claim 31, wherein:
the first voltage reference circuit generates the one or more intermediate voltages such that a first voltage difference between the one or more intermediate voltages and the selected bit line voltage is less than a second voltage difference between the selected word line voltage and the one or more intermediate voltages by a particular amount, the particular amount is based on the temperature.

33. The non-volatile storage system of claim 31, wherein:
the first voltage reference circuit and the second voltage reference circuit generate voltages that are complementary to absolute temperature.

34. The non-volatile storage system of claim 31, wherein:
the one or more intermediate voltages are greater than the selected bit line voltage and less than the selected word line voltage.

35. The non-volatile storage system of claim 31, wherein:
the plurality of bit lines comprises vertically oriented bit lines; and
the first semiconductor storage element comprises a non-volatile storage element.

* * * * *